(12) United States Patent
Bour et al.

(10) Patent No.: US 10,418,519 B2
(45) Date of Patent: Sep. 17, 2019

(54) LED SIDEWALL PROCESSING TO MITIGATE NON-RADIATIVE RECOMBINATION

(71) Applicant: Apple Inc., Cupertino, CA (US)

(72) Inventors: David P. Bour, Cupertino, CA (US);
Dmitry S. Sizov, Cupertino, CA (US);
Daniel A. Haeger, Fremont, CA (US);
Xiaobin Xin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/777,169

(22) PCT Filed: Dec. 14, 2016

(86) PCT No.: PCT/US2016/066700
§ 371 (c)(1),
(2) Date: May 17, 2018

(87) PCT Pub. No.: WO2017/112490
PCT Pub. Date: Jun. 29, 2017

(65) Prior Publication Data

US 2018/0374991 A1    Dec. 27, 2018

Related U.S. Application Data

(60) Provisional application No. 62/271,189, filed on Dec. 22, 2015.

(51) Int. Cl.
*H01L 33/14* (2010.01)
*H01L 33/00* (2010.01)
(Continued)

(52) U.S. Cl.
CPC ........ *H01L 33/145* (2013.01); *H01L 33/0095* (2013.01); *H01L 33/02* (2013.01);
(Continued)

(58) Field of Classification Search
CPC .............................. H01L 33/62; H01L 33/145
See application file for complete search history.

(56) References Cited

U.S. PATENT DOCUMENTS 5,345,464 A    9/1994 Takemoto
6,768,759 B2   7/2004 Honkawa et al.
(Continued)

FOREIGN PATENT DOCUMENTS

JP    S60-223186    11/1985
JP    H02-114675    4/1990
(Continued)

OTHER PUBLICATIONS

PCT International Search Report and Written Opinion for International Application No. PCT/US2016/066700, dated Jun. 29, 2017, 9 pages.
(Continued)

*Primary Examiner* — Dung A. Le
(74) *Attorney, Agent, or Firm* — Jaffery Watson Mendonsa & Hamilton LLP

(57) ABSTRACT

LEDs and methods of forming LEDs with various structural configurations to mitigate non-radiative recombination at the LED sidewalls are described. The various configurations described include combinations of LED sidewall surface diffusion with pillar structure, modulated doping profiles to form an n-p superlattice along the LED sidewalls, and selectively etched cladding layers to create entry points for shallow doping or regrowth layers.

14 Claims, 32 Drawing Sheets

(51) Int. Cl.
*H01L 33/02* (2010.01)
*H01L 33/44* (2010.01)
*H01L 33/62* (2010.01)

(52) U.S. Cl.
CPC ............ *H01L 33/025* (2013.01); *H01L 33/14* (2013.01); *H01L 33/44* (2013.01); *H01L 33/62* (2013.01)

(56) References Cited

U.S. PATENT DOCUMENTS

| | | | |
|---|---|---|---|
| 7,356,063 | B2 | 4/2008 | Katsuyama et al. |
| 8,981,340 | B2 | 3/2015 | Kawaguchi et al. |
| 9,048,383 | B2 | 6/2015 | Mayer et al. |
| 9,455,373 | B2 | 9/2016 | Yokozeki et al. |
| 2002/0134987 | A1 | 9/2002 | Takaoka |
| 2007/0045633 | A1* | 3/2007 | Takiguchi .............. B82Y 20/00 257/79 |
| 2010/0246613 | A1* | 9/2010 | Hasegawa .............. B82Y 20/00 372/20 |
| 2013/0026447 | A1 | 1/2013 | Kloth et al. |
| 2013/0070798 | A1 | 3/2013 | Sakaino et al. |
| 2014/0050244 | A1 | 2/2014 | Ohno et al. |
| 2014/0117395 | A1 | 5/2014 | Kim et al. |

FOREIGN PATENT DOCUMENTS

| | | |
|---|---|---|
| JP | H06-163981 | 6/1994 |
| JP | 2013-110374 A | 6/2013 |
| JP | 2013-530543 A | 7/2013 |
| WO | WO 2012-0150647 A1 | 11/2012 |
| WO | WO 2015-099944 A1 | 7/2015 |

OTHER PUBLICATIONS

JP Office Action (with translation) for Japanese Application No. 2018-521638, dated Apr. 23, 2019, 12 pages.

* cited by examiner

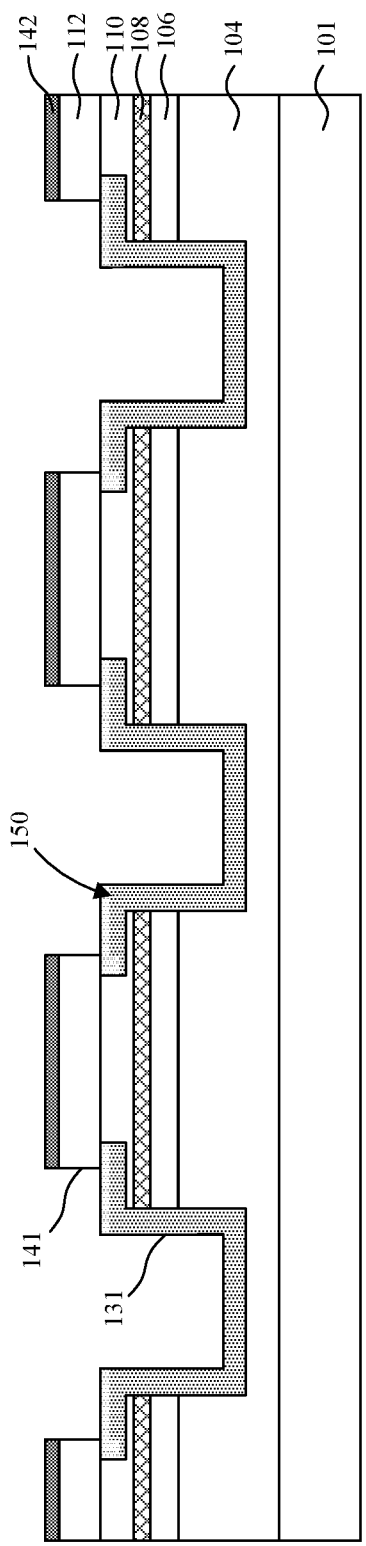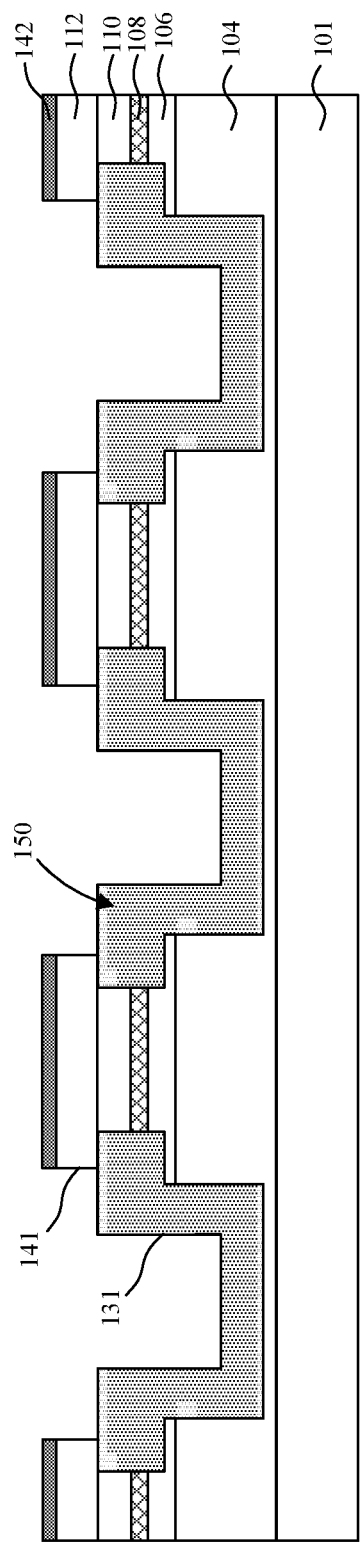

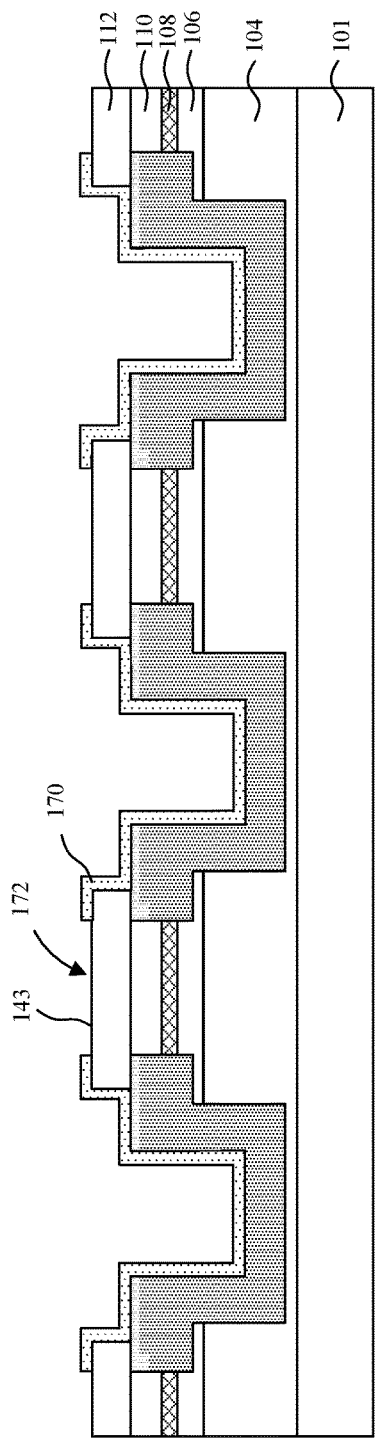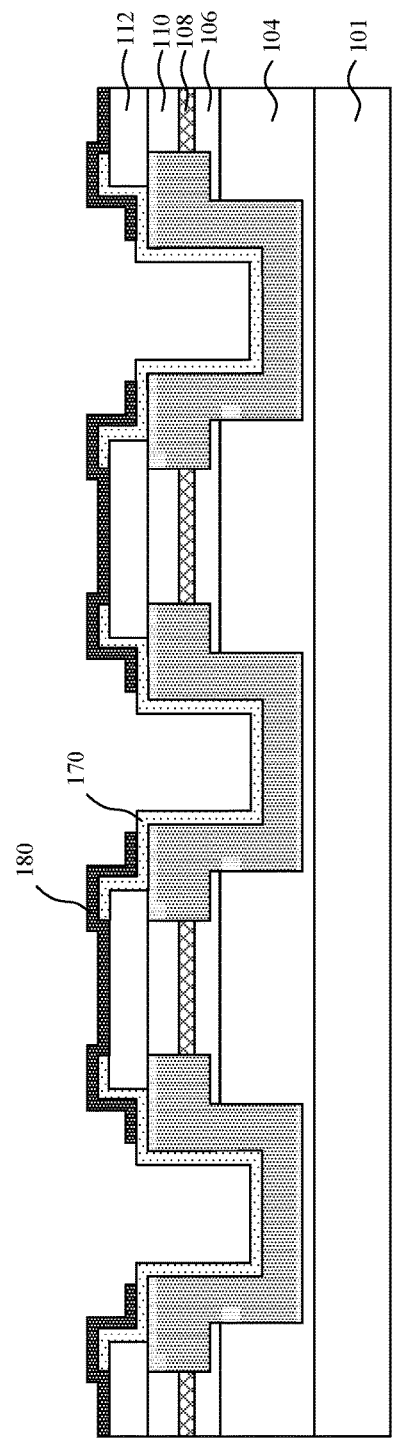

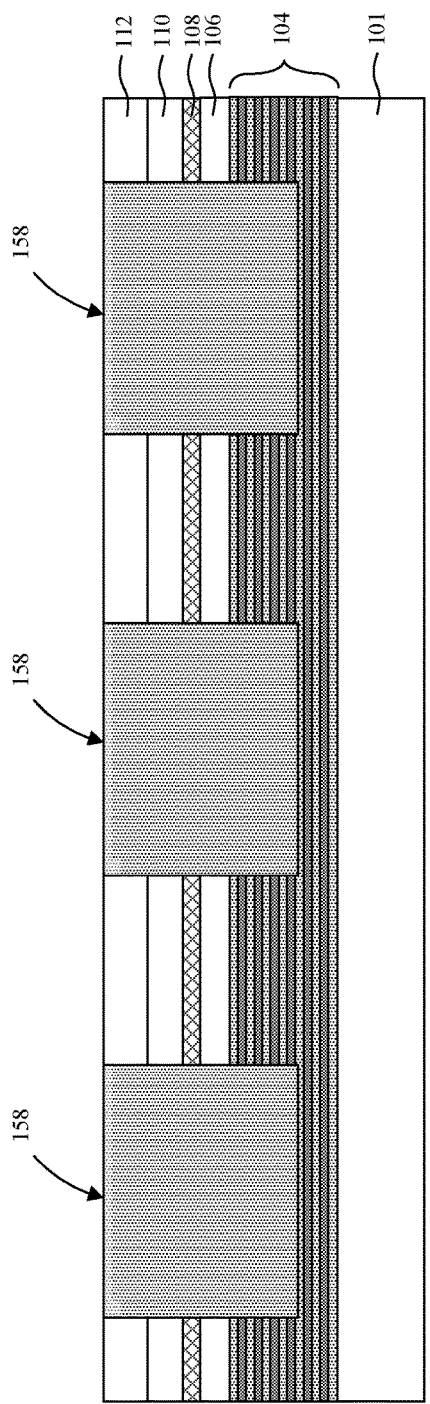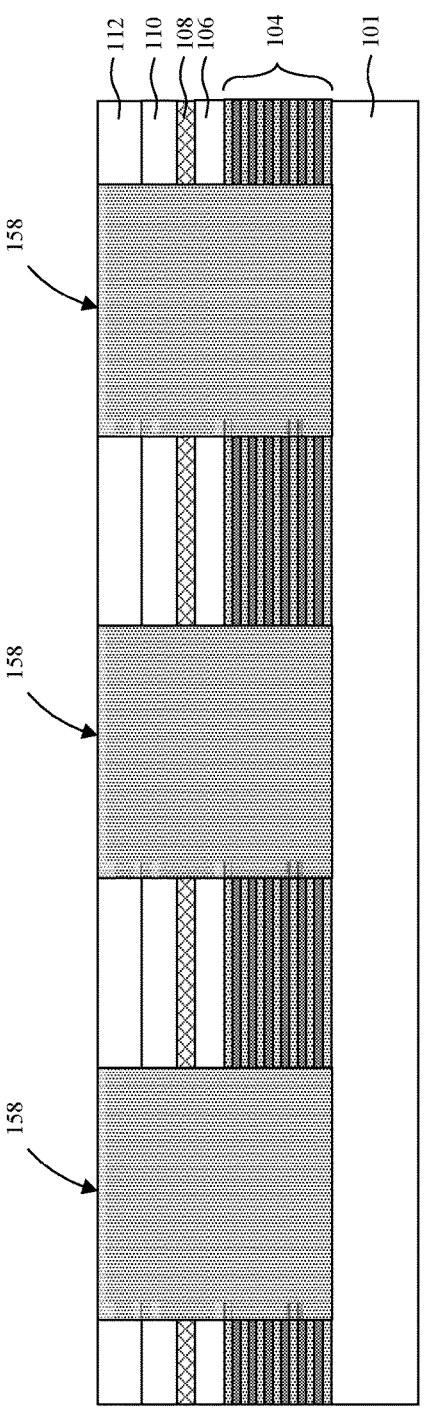
FIG. 19A
FIG. 19B

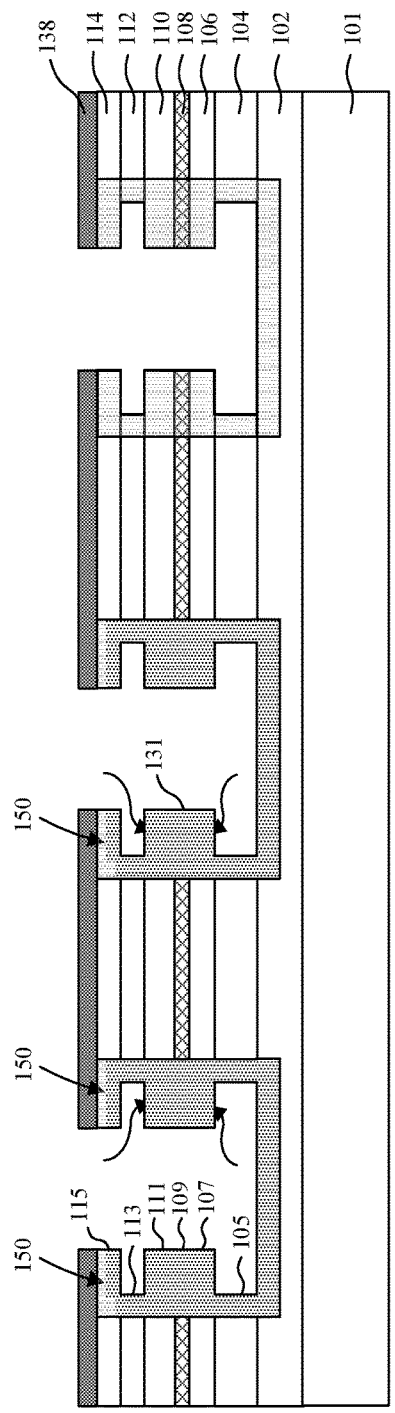
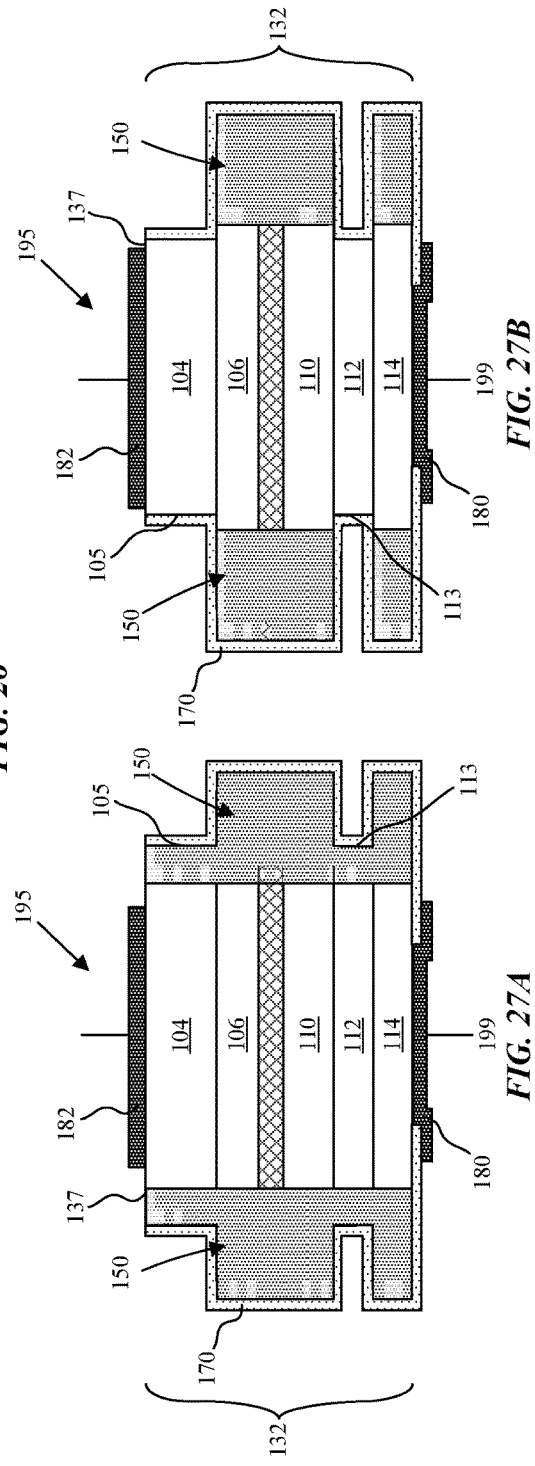
FIG. 26
FIG. 27A
FIG. 27B

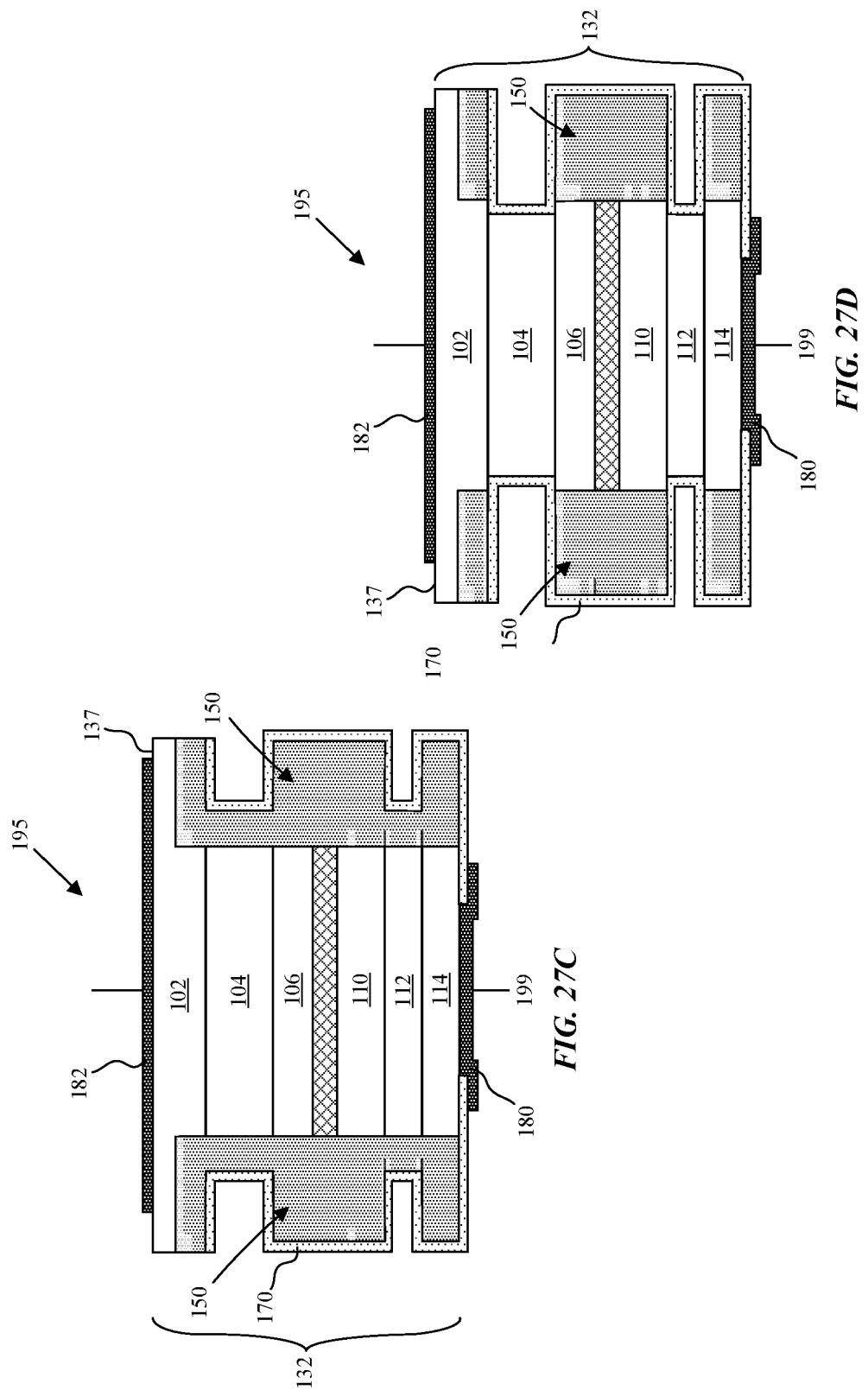

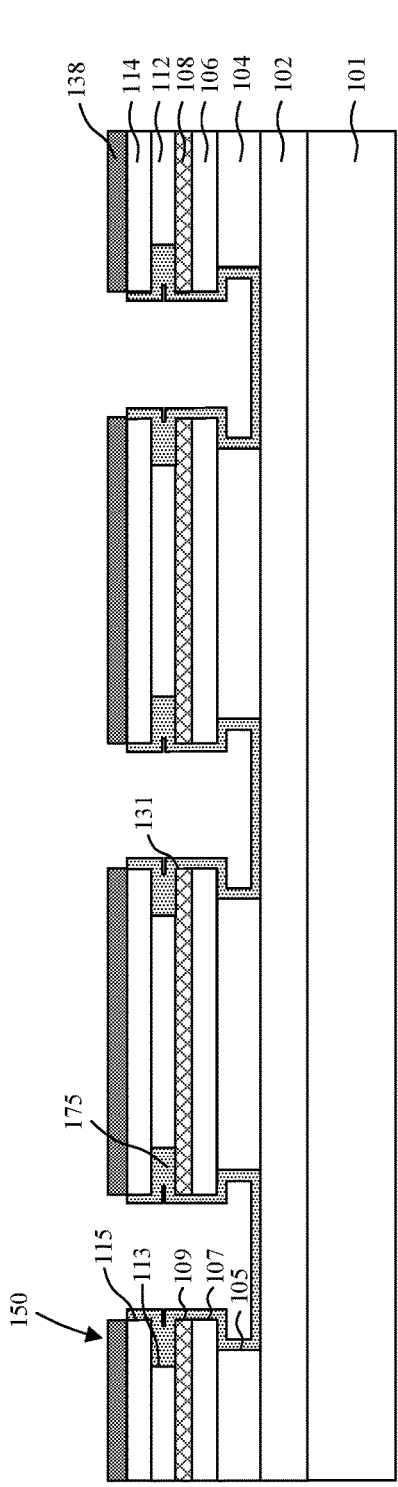
*FIG. 31*
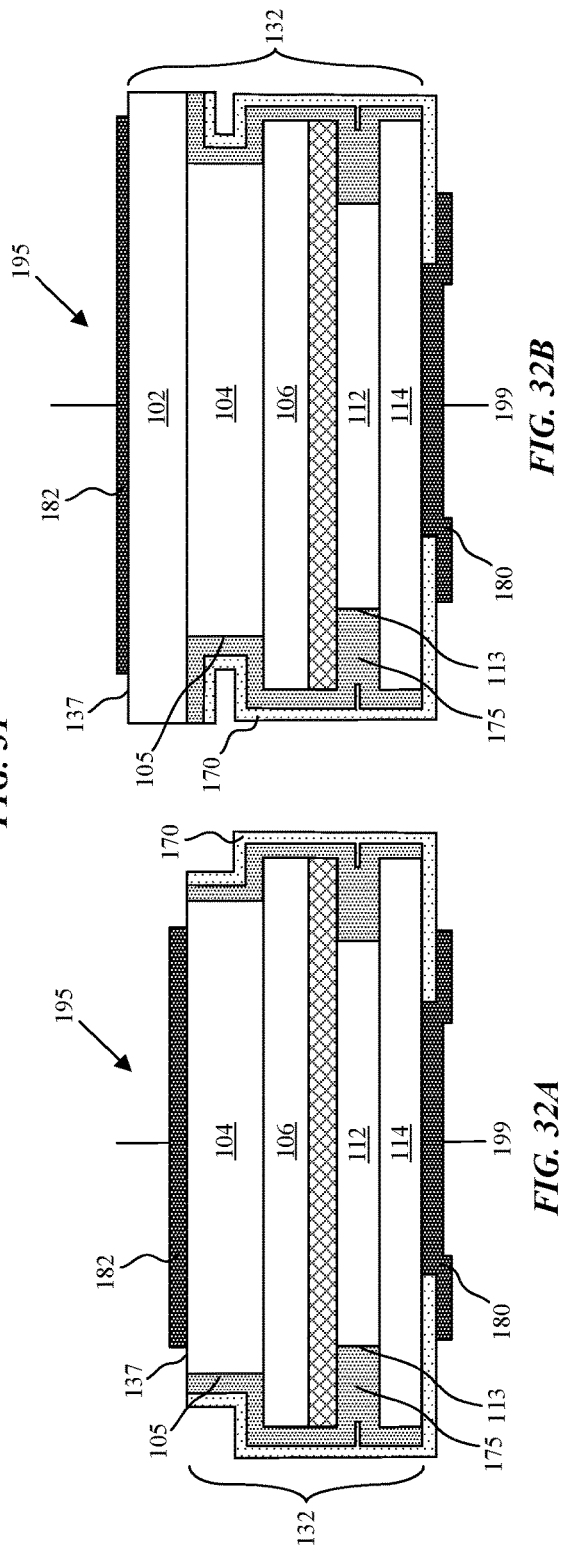
*FIG. 32A*
*FIG. 32B*

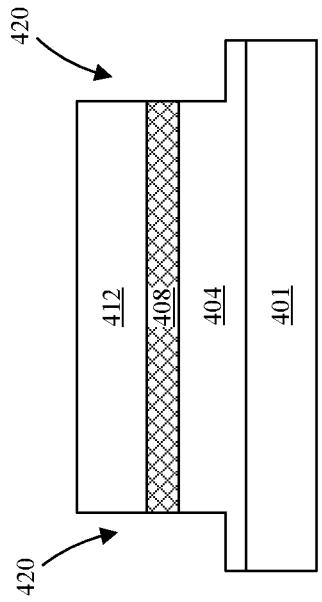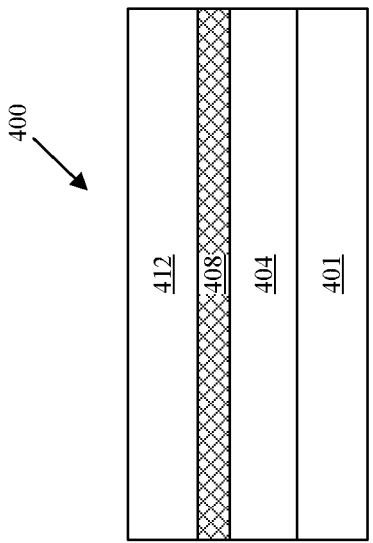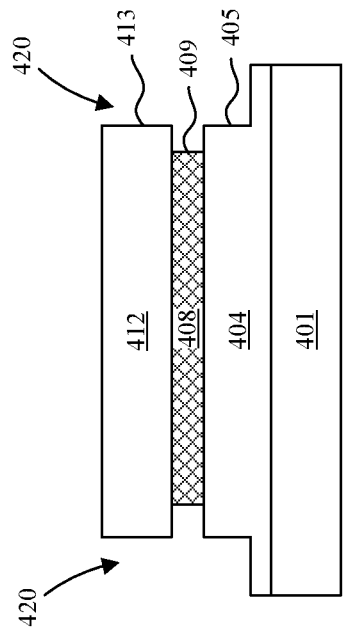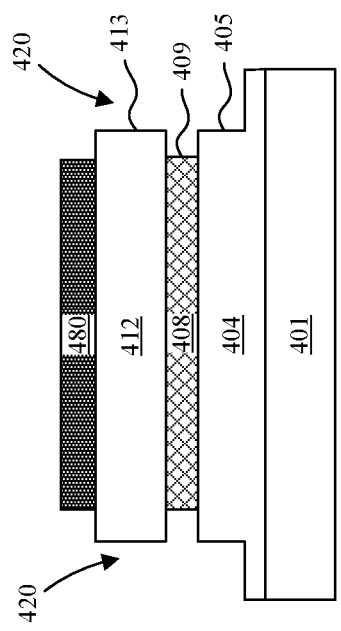
FIG. 33A
FIG. 33B
FIG. 33C
FIG. 33D

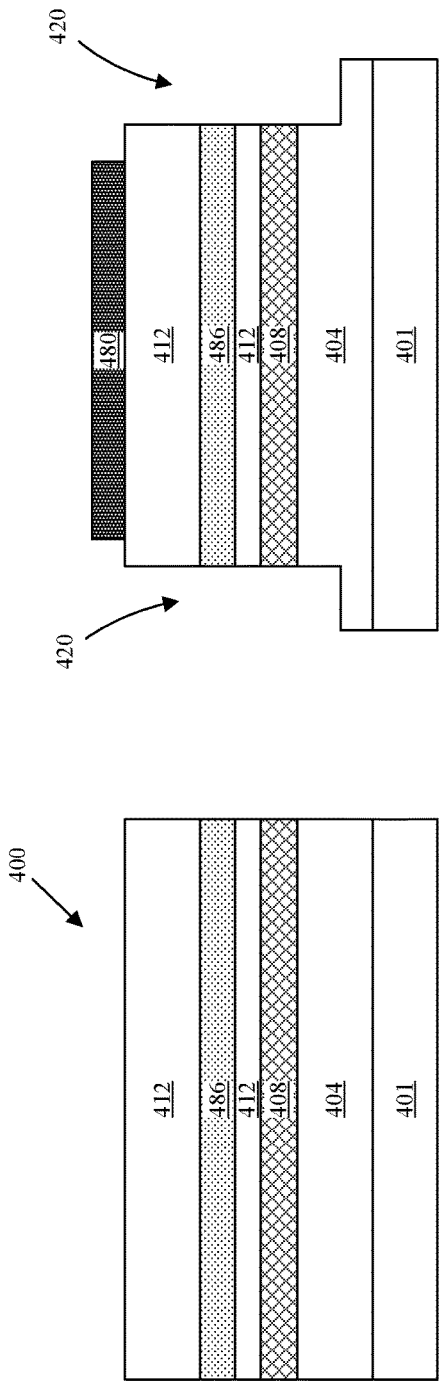
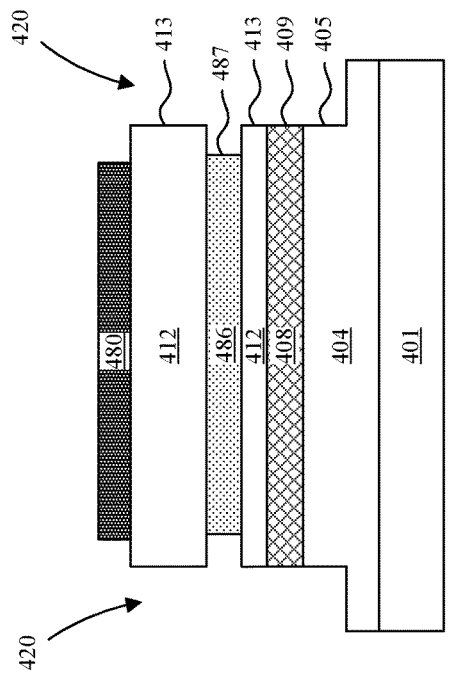
FIG. 34A
FIG. 34B
FIG. 34C

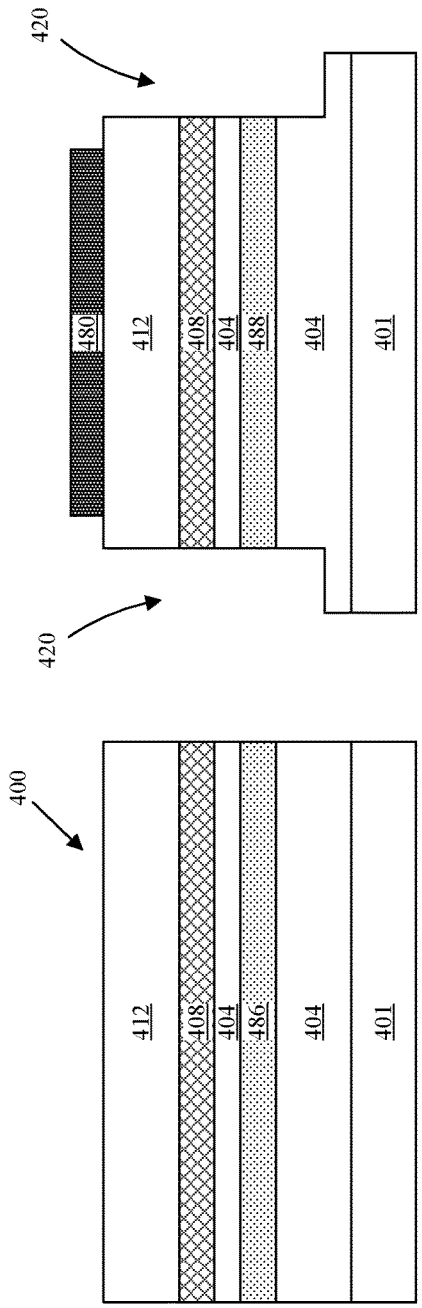
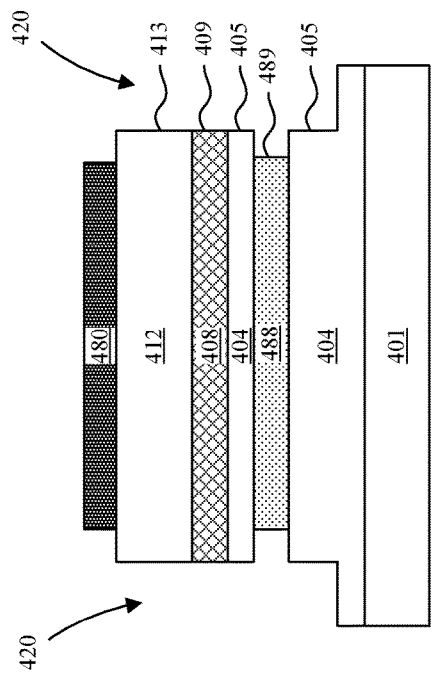
FIG. 35A
FIG. 35B
FIG. 35C

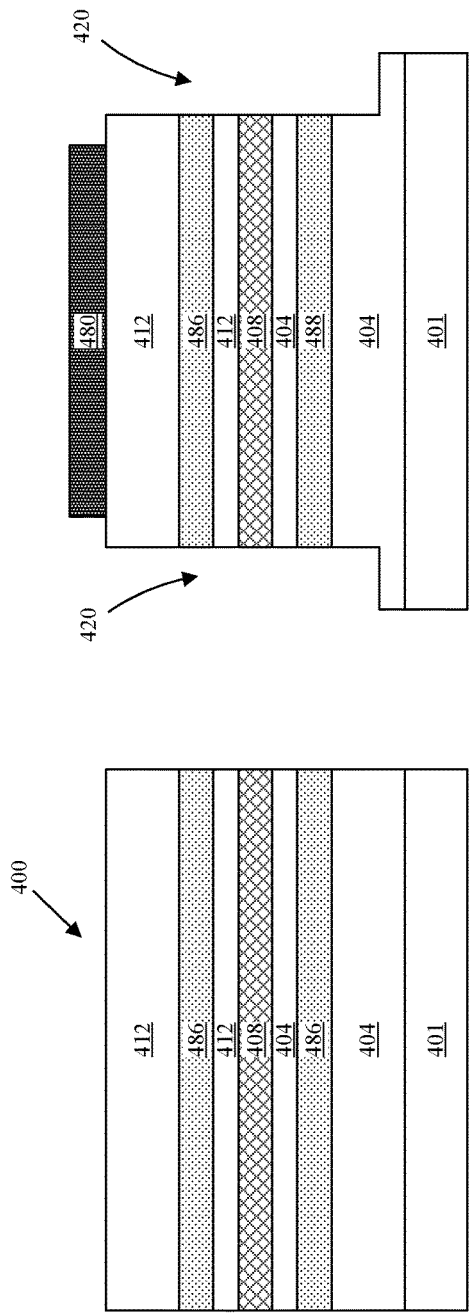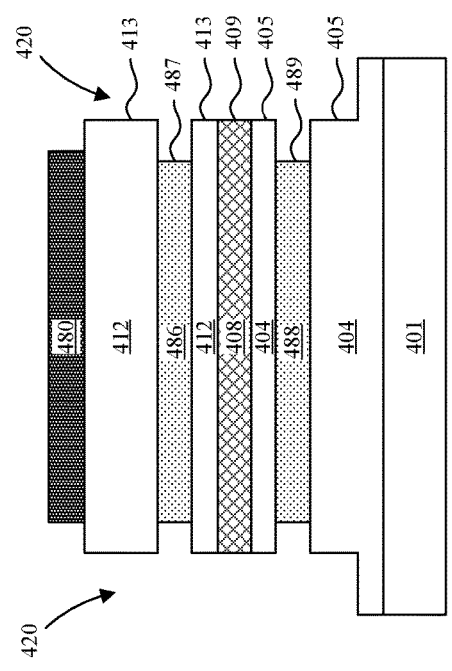

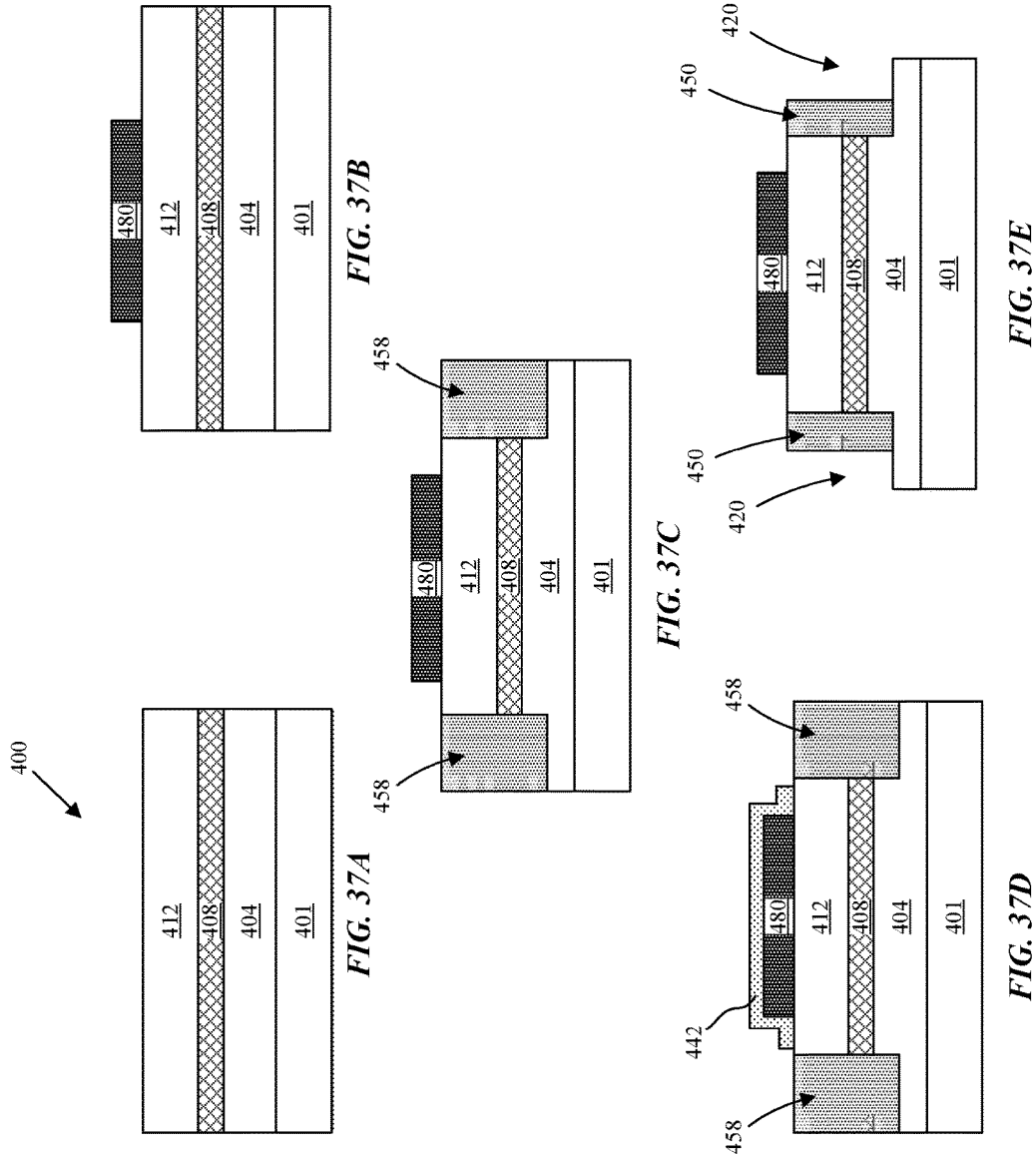

LED SIDEWALL PROCESSING TO MITIGATE NON-RADIATIVE RECOMBINATION

CROSS-REFERENCE TO RELATED APPLICATIONS

This patent application is a U.S. National Phase Application under 35 U.S.C. § 371 of International Application No. PCT/US2016/066700, filed Dec. 14, 2016, entitled LED SIDEWALL PROCESSING TO MITIGATE NON-RADIATIVE RECOMBINATION which claims the benefit of priority of U.S. Provisional Application No. 66/271,189 filed Dec. 22, 2015, both of which incorporated herein by reference.

BACKGROUND

Field

Embodiments described herein relate to light emitting diodes (LEDs). More particularly, embodiments relate to LED structures to mitigate non-radiative recombination at the LED sidewalls.

Background Information

Flat panel display panels are gaining popularity in a wide range of electronic devices ranging from mobile electronics, to televisions and large outdoor signage displays. Demand is increasing for higher resolution displays, as well as for thinner, lighter weight, and lower cost electronic devices with larger screens. Conventional organic light emitting diode (OLED) technologies feature emissive organic layers over a thin film transistor (TFT) substrate. Conventional liquid crystal display (LCD) technologies feature a liquid crystal layer over a TFT substrate, and a backlighting unit. More recently, it has been proposed to incorporate emissive inorganic semiconductor-based micro LEDs into high resolution displays.

SUMMARY

Embodiments describe light emitting structures (e.g. LEDs) and methods of forming light emitting structures (e.g. LEDs) with various structural configurations to mitigate non-radiative recombination at the light emitting structure (e.g. LED) sidewalls. In some embodiments, the light emitting structure configurations combine light emitting structure sidewall surface diffusion to mitigate carrier diffusion to the light emitting structure surfaces, with pillar structures for internally confining the current injection region. In some embodiments, light emitting structures include modulated doping profiles within a cladding layer and sidewall dopant profiles to form an n-p superlattice along the light emitting structure sidewalls. In some embodiments, light emitting structures include selectively etched cladding layers to create entry points for shallow doping or regrowth layers.

In an embodiment, a light emitting structure (e.g. LED structure) includes a body (e.g. an LED body), which includes a first (e.g. top) cladding layer doped with a first dopant type, a barrier layer (e.g. bottom barrier layer), and an active layer between the first cladding layer and the barrier layer. In such an embodiment, a pillar structure protrudes from a first (e.g. bottom) surface of the body, and the pillar structure includes a second (e.g. bottom) cladding layer doped with a second dopant type opposite the first dopant type. The light emitting structure may further include a confinement region including a dopant concentration spanning sidewalls of the body and the first surface of the body. In an embodiment, the dopant concentration is formed of the second dopant type and encroaches from the sidewalls of the body toward a center vertical axis of the light emitting structure and from the first surface of the body toward the active layer, and the dopant concentration laterally encroaches toward a center vertical axis of the light emitting structure within the body past sidewalls of the pillar structure. For example, the dopant concentration may encroach from the sidewalls of the body toward the center vertical axis and from the bottom surface of the body toward the active layer. The dopant concentration may also encroach laterally above sidewalls of the pillar structure within the body toward the center vertical axis.

In an embodiment, the pillar structure protrudes from a surface (e.g. bottom surface) of the barrier layer, the confinement region dopant concentration spans the surface (e.g. bottom surface) of the barrier layer, and the dopant concentration encroaches laterally toward the center vertical axis within the barrier layer past the sidewalls of the pillar structure. For example, the dopant concentration may encroach laterally within the barrier toward the center vertical axis and above the sidewalls of the pillar structure.

In an embodiment, the first dopant type is n-type, the second dopant type is p-type, and the dopant concentration is formed of a Mg or Zn dopant. In an embodiment, a conformal passivation layer is formed on and spans the sidewalls of the body, the sidewalls of the pillar structure, and a surface (e.g. bottom surface) of the pillar structure opposite the body. An opening may be formed in the conformal passivation layer on the surface of the pillar structure, and a conductive contact (e.g. bottom conductive contact) formed on the surface (e.g. bottom surface) of the pillar structure and within the opening of the conformal passivation layer.

In an embodiment, the dopant concentration encroaches further toward the center vertical axis within the barrier layer (e.g. bottom barrier layer) than within the active layer and the first (e.g. top) cladding layer. The light emitting structure may further include a base (e.g. top base) including a first (e.g. bottom surface), and the body protrudes from the first surface of the base, and the first surface of the base is wider than the body. The dopant concentration may span the first (e.g. bottom) surface of the base (e.g. top base), and encroach toward a second (e.g. top) surface of the base opposite the first (e.g. bottom) surface of the base. A second (e.g. top) conductive contact may be formed on the second (e.g. top) surface of the base. In an embodiment, the conductive contact (e.g. bottom conductive contact) is bonded to a contact pad on a display substrate with a solder material.

In an embodiment, the dopant concentration encroaches further toward the center vertical axis within the barrier layer (e.g. bottom barrier layer) and within the active layer than within the first (e.g. top) cladding layer. The light emitting structure may further include a base (e.g. top base) including a first (e.g. bottom surface), and the body protrudes from the first surface of the base, and the first surface of the base is wider than the body. The dopant concentration may span the first (e.g. bottom) surface of the base (e.g. top base), and encroach toward a second (e.g. top) surface of the base opposite the first (e.g. bottom) surface of the base. A second (e.g. top) conductive contact may be formed on the second (e.g. top) surface of the base. In an embodiment, the conductive contact (e.g. bottom conductive contact) is bonded to a contact pad on a display substrate with a solder material.

In an embodiment, a light emitting structure (e.g. LED structure) includes a body (e.g. an LED body), which includes a first (e.g. top) cladding layer doped with a first dopant type, a second (e.g. bottom) cladding layer doped with a second dopant type opposite the first dopant type, and an active layer between the first cladding layer and the second cladding layer. A confinement region including a dopant concentration may span sidewalls of the first (e.g. top) cladding layer, the active layer, and the second (e.g. bottom) cladding layer, where the dopant concentration encroaches from the sidewalls of the first cladding layer, the active layer, and the second cladding layer toward a center vertical axis of the light emitting structure. In an embodiment, the first dopant type is n-type, the second dopant type is p-type, and the dopant concentration is formed of a Mg or Zn p-dopant. In an embodiment, the dopant concentration does not extend to a surface (e.g. top surface) of the first (e.g. top) cladding layer opposite the active layer. The light emitting structure may include a p-n junction on the sidewalls of the first (e.g. top) cladding layer. In an embodiment, the first cladding layer includes alternating n-regions and n+ regions on top of one another. For example, the n− regions may have an n-dopant concentration less than the p-dopant concentration in the portion of the dopant concentration overlapping the n− regions. The n+ regions may have an n-dopant concentration greater than the p-dopant concentration in the portion of the dopant concentration overlapping the n+ regions.

In an embodiment, a light emitting structure (e.g. LED structure) includes a body (e.g. an LED body), which includes a first (e.g. top) cladding layer doped with a first dopant type, a contact layer (e.g. bottom contact layer) doped with a second dopant type opposite the first dopant type, and an active layer between the first cladding layer and the contact layer. The body may additionally include a second (e.g. bottom) cladding layer between the contact layer and the active layer, the second cladding layer doped with the second dopant type, a first (e.g. top) barrier layer between the first cladding layer and the active layer, and a second (e.g. bottom) barrier layer between the second cladding layer and the active layer. In an embodiment, lateral edges of the first (e.g. top) cladding layer and the second (e.g. bottom) cladding layer are closer to a center vertical axis of the body than lateral edges of the first (e.g. top) barrier layer, the active layer, and the second (e.g. bottom) barrier layer. In an embodiment, the first dopant type is n-type, the second dopant type is p-type. The light emitting structure may further include a confinement region including a p-dopant concentration spanning the lateral edges of the n-doped first (e.g. top) cladding layer, the first (e.g. top) barrier layer, the active layer, the second (e.g. bottom) barrier layer, the p-doped second (e.g. bottom) cladding layer, and the p-doped contact layer. In an embodiment, the p-dopant concentration occupies a larger volume of the active layer than the first (e.g. top) barrier layer, and the p-dopant concentration occupies a larger volume of the active layer than the second (e.g. bottom) barrier layer.

In an embodiment, a light emitting structure (e.g. LED structure) includes a body (e.g. an LED body), which includes a first (e.g. top) cladding layer doped with a first dopant type, a contact layer (e.g. bottom contact layer) doped with a second dopant type opposite the first dopant type, an active layer between the first cladding layer and the contact layer, a second (e.g. bottom) cladding layer between the contact layer and the active layer, the second cladding layer doped with the second dopant type, and a barrier layer (e.g. top barrier layer) between the first cladding layer and the active layer. In an embodiment, lateral edges of the first (e.g. top) cladding layer and the second (e.g. bottom) cladding layer are closer to a center vertical axis of the body than lateral edges of the barrier layer (e.g. top barrier layer) and the active layer. In an embodiment, the first dopant type is n-type, the second dopant type is p-type. The light emitting structure may further include a regrown layer directly on the lateral edges of the first (e.g. top) cladding layer, the barrier layer, the active layer, the second (e.g. bottom) cladding layer, and the contact layer. The regrown layer may be doped with a dopant such as Te or Fe. In an embodiment, the regrown layer fills a volume directly between the contact layer (e.g. bottom contact layer) and the active layer, and laterally adjacent to the second (e.g. bottom) cladding layer.

BRIEF DESCRIPTION OF THE DRAWINGS

FIG. 5A is a schematic cross-sectional side view illustration of a shallow surface doping profile in accordance with an embodiment.

FIG. 5B is a schematic cross-sectional side view illustration of deep surface doping profile in accordance with an embodiment.

FIG. 6 is a schematic cross-sectional side view illustration of a patterned passivation layer formed over an array of pillar structures and mesa structures in accordance with an embodiment.

FIG. 7 is a schematic cross-sectional side view illustration of an array of bottom conductive contacts formed within the openings in the patterned passivation layer in accordance with an embodiment.

FIGS. 19A-19B are schematic cross-sectional side view illustrations of dopant wells formed in bulk LED substrates in accordance with embodiments.

FIG. 26 is a schematic cross-sectional side view illustration of a shallow doping profile in accordance with an embodiment.

FIGS. 27A-27D are schematic cross-sectional side view illustrations of LEDs including selectively etched cladding layers and shallow doping in accordance with embodiments.

FIG. 31 is a schematic cross-sectional side view illustration of a regrowth layer in accordance with an embodiment.

FIGS. 32A-32B are schematic cross-sectional side view illustrations of an LED including selectively etched cladding layers and a regrowth layer in accordance with embodiments.

FIGS. 33A-33D are schematic cross-sectional side view illustrations of a method of forming LEDs with a selectively etched active region in accordance with an embodiment.

FIGS. 34A-34C are schematic cross-sectional side view illustrations of a method of forming LEDs with a selectively etched sacrificial region in accordance with an embodiment.

FIGS. 35A-35C are schematic cross-sectional side view illustrations of a method of forming LEDs with a selectively etched sacrificial region in accordance with an embodiment.

FIGS. 36A-36C are schematic cross-sectional side view illustrations of a method of forming LEDs with selectively etched sacrificial regions in accordance with an embodiment.

FIGS. 37A-37E are schematic cross-sectional side view illustrations of a method of forming LEDs including forming an array of mesa trenches and mesa structures in accordance with embodiments.

DETAILED DESCRIPTION

Figure 1A:
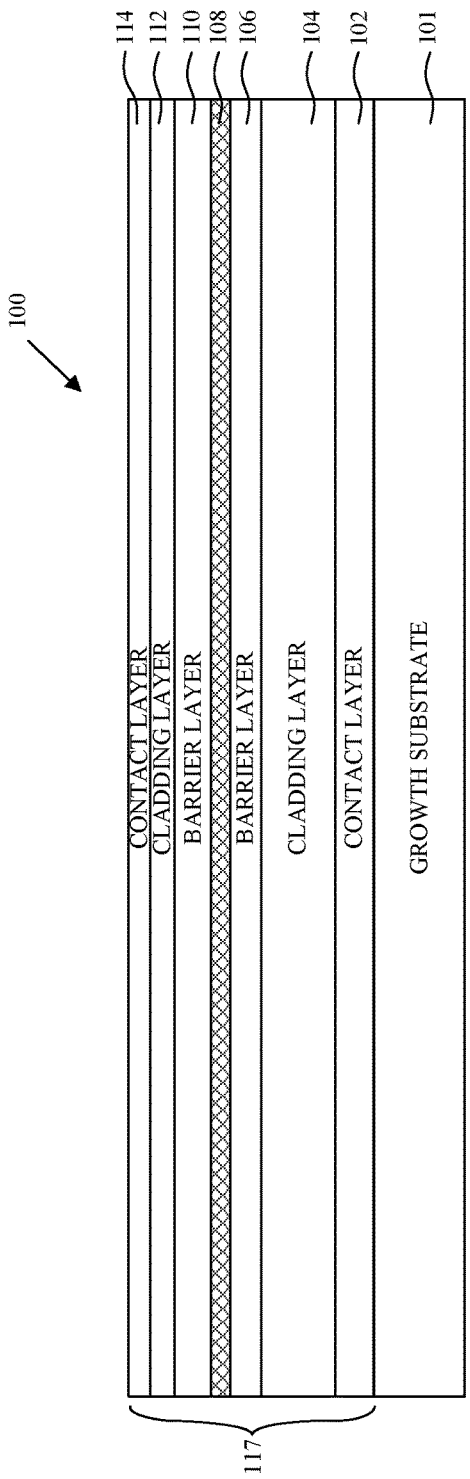
FIG. 1A is a schematic cross-sectional side view illustration of a bulk LED substrate in accordance with an embodiment.

Embodiments describe LEDs and methods of forming LEDs with various structural configurations to mitigate non-radiative recombination at the LED sidewalls. In particular, embodiments describe micro LEDs and methods of forming micro LEDs with various structural configurations to mitigate non-radiative recombination at the LED sidewalls. In accordance with embodiments, the micro LEDs may be formed of inorganic semiconductor-based materials, and have maximum lateral dimensions between sidewalls of 1 to 300 µm, 1 to 100 µm, 1 to 20 µm, or more specifically 1 to 10 µm, such as 5 µm where the LED lateral dimensions approach the carrier diffusion length.

It has been observed that the sidewalls for emissive LEDs, and particularly for micro LEDs, may represent non-radiative recombination sinks for injected carriers. This may be due to the sidewalls being characterized by unsatisfied bonds, chemical contamination, and structural damage (particularly if dry-etched). Injected carriers recombine non-radiatively at states associated with these defects. Thus, the perimeter of an LED may be optically dead, and the overall efficiency of the LED is reduced. This non-radiative recombination can also be a result of band bending at the surface leading to a density of states were electrons and holes can be confined until they combine non-radiatively. The characteristic distance over which the sidewall surface effect occurs is related to the carrier diffusion length, which may typically be 1-10 µm in some applications in accordance with embodiments. Thus, the efficiency degradation is particularly severe in micro LEDs in which the LED lateral dimensions approach the carrier diffusion length.

Such non-radiative recombination may have a significant effect on LED device efficiency, particularly when the LED is driven at low current densities in the pre-droop region of its characteristic internal quantum efficiency (IQE) curve where the current is unable to saturate the defects. In accordance with embodiments, sidewall surface modification, current confinement structures, and combinations thereof are described such that the amount of non-radiative recombination near the exterior or side surfaces of the active layer can be reduced and efficiency of the LED device increased.

In one aspect, embodiments describe an LED structure that includes a doped confinement region (e.g. p-doped) including a dopant (e.g. Mg, Zn) concentration spanning sidewalls of an LED body and the bottom surface of the bottom barrier layer from which a pillar structure including a doped cladding layer (e.g. p-doped) protrudes. Thus, the embodiments describe LED configurations that combine LED body sidewall surface modification to mitigate carrier diffusion to the LED surfaces with pillar structures for internally confining the current injection region. This may potentially 1) reduce carrier diffusion to the sidewall surfaces, 2) screen Fermi-level pinning effect, and/or 3) reduce carrier drift to the LED sidewall surfaces.

In another aspect, embodiments describe an LED structure that incorporates a modulated doping profile (e.g. n+, n−) within a doped (e.g. n-type) cladding layer. In an embodiment, a dopant of the opposite dopant type (e.g. p-dopant such as Zn) is diffused into sidewalls of the LED structure. An n-p superlattice is formed where the p-dopant overlaps the modulated n-type doping profile within the n-type cladding layer. Through proper adjustment of the resultant n- and p-layer thicknesses in the n-p superlattice, the as-grown n-type doping profile, and the concentration of the diffused p-dopant, an extended current-blocking structure may be formed along the LED sidewalls. The back-to-back p-n junctions (i.e. extended depletion region) in the n-p superlattice may be employed to 1) achieve some current confinement, 2) minimize leakage current associated with a parasitic p-n junction formed by the p-dopant diffusion, 3) minimize nonradiative recombination at the LED sidewalls, and/or 4) relax the alignment tolerance for the n-contact electrode.

In another aspect, embodiments describe LED structures that include selectively etched cladding layers. In one embodiment, selectively etched cladding layers create entry points for shallow dopant (e.g. p-dopant such as Zn) diffusion into the active layer. In such an embodiment, the selective etching may allow for shallow p-dopant diffusion with a lower thermal or time budget. In one embodiment, a regrown layer is formed after selective etching of the cladding layers in order to reduce surface recombination due to exposed surfaces near the active layer.

In another aspect, embodiments describe LED structures that include a selectively etched active region or sacrificial layer within the LED body. Selective etching may remove damage caused by during mesa trench etching and/or confine current internally within the LED body. In an embodiment, selective etching is performed with a photo electro chemical (PEC) etching technique.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "top", "bottom", "above", "over", "to", "between", "spanning", and "on" as used herein may refer to a relative position of one layer with respect to other layers. One layer "above", "over", "spanning", or "on" another layer or bonded "to" or in "contact" with another layer may be directly in contact with the other layer or may have one or more intervening layers. One layer "between" layers may be directly in contact with the layers or may have one or more intervening layers. Furthermore, the designation of "top" and "bottom" layers and surfaces refers to the relative position of the layers with respect to one another, though the designations may be reversed, for example in an integrated structure.

In the following description exemplary processing sequences and structures are described for forming LEDs. Referring now to FIG. 1A, a cross-sectional side view illustration is provided of a bulk LED substrate 100 in accordance with an embodiment of the invention. The bulk LED substrate 100 structure may be applicable to a variety of compositions and designed emission spectra. For example, the bulk LED substrate 100 may include II-VI materials, III-V nitride materials, or III-V phosphide materials and designed for emission of a variety of emission spectra. For example, the bulk LED substrate 100 may be fabricated with an AlInGaP material system or ZnMgBeSSe material system. In a specific embodiment, the bulk LED substrate 100 is based on an AlInGaP material system and is designed for red color emission. For example, bulk LED substrate 100 may be designed for a peak emission wavelength between 600 nm-750 nm, such as 625 nm. Thus, while the following structures are described with regard to an AlInGaP material system, the exemplary structures may be used for LEDs based on different material systems.

Figure 1B:
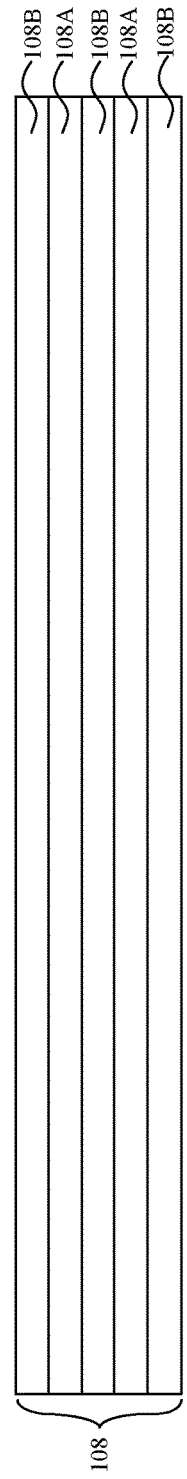
FIG. 1B is a schematic cross-sectional side view illustration of a multiple quantum well (MQW) active layer in accordance with an embodiment.

In one embodiment, formation of the bulk LED substrate 100 begins with the formation of a device layer 117 on a growth substrate 101, such as a GaAs growth substrate, for example with a thickness of 250-1,000 μm. Growth substrate 101 may optionally be doped, for example with an n-type dopant such as silicon (Si) or tellurium (Te). Layers 102-114 of the device layer 117 may then be grown on the growth substrate 101 using a suitable technique such as metal organic chemical vapor deposition (MOCVD). As shown, an n-type contact layer 102 is optionally grown on the growth substrate 101, for example to a thickness of 0.1-1.0 μm. In an embodiment, n-type contact layer 102 is formed of AlInGaP with a Si or Te dopant concentration of $0.5\text{-}4\times10^{18}$ cm$^{-3}$. The n-type contact layer 102 may not be present for all LED applications. An n-type cladding layer 104 is then grown on the optional n-type contact layer 102, for example to a thickness of 0.05-0.5 μm. N-type cladding layer 104 may be formed of materials such as AlInP, AlGaInP, and AlGaAs. In an embodiment, n-type cladding layer 104 is formed of AlInP with a Si dopant concentration of $1\times10^{18}$ cm$^{-3}$. An n-side (top) barrier layer 106 is then grown on the n-type cladding layer 104, for example to a thickness of 0.05-0.5 μm. N-side barrier layer 106 may be formed of materials such as AlInP, AlGaInP, and AlGaAs. In an embodiment, n-side barrier layer 106 is formed of AlInGaP, and is unintentionally doped during growth. In an embodiment, the n-side barrier layer 106 does not have a graded composition (e.g. Aluminum content is uniform). An active region 108 is then grown on the n-side barrier layer 106. Active region 108 may include one or more quantum well (QW) layers or bulk active layers. In an embodiment illustrated in FIG. 1B, the one or more quantum well layers 108A or bulk active layers are formed of InGaP or AlInGaP, separated by spacer layers 108B of the same alloy (e.g. AlInGaP) as the surrounding barrier layers. A p-side (bottom) barrier layer 110 is then optionally grown on the active layer 108, for example to a thickness of 0.05-0.5 µm, or more specifically approximately 100 nm. P-side barrier layer 110 may be formed of materials such as AlInP, AlGaInP, and AlGaAs. In an embodiment, p-side barrier layer 110 is formed of AlInGaP, and is unintentionally doped during growth. A p-type (bottom) cladding layer 112 may then be formed on the p-side barrier layer 110. The p-type cladding layer 112 may be formed of materials such as AlInP, AlGaInP, and AlGaAs. In an embodiment, p-type cladding layer 112 is formed of AlInP with a Mg dopant concentration of $5\times10^{17}$ cm$^{-3}$-$1.5\times10^{18}$ cm$^{-3}$. In an embodiment, the p-type cladding layer 112 may have a substantially uniform p-dopant concentration, less a concentration gradient due to diffusion with the surrounding layers. In an embodiment, the p-dopant concentration is not uniform. For example, doping may begin after a specific set back distance, such as 100-200 nm into the p-type cladding layer 112. A p-type contact layer 114 is then optionally grown on the p-type cladding layer 112, for example to a thickness of 0.1-50.0 µm, for example to 0.1-1.5 µm for a thinner LED. In an embodiment, the optional p-type contact layer 114 is formed of GaP or GaAs, for example, with a Mg, Zn, or C dopant concentration of $1\times10^{18}$ $1\times10^{19}$ cm$^{-3}$.

In accordance with embodiments, the barrier layers 106, 110 may be formed of a material with a large conduction band offset with respect to the one or more quantum well layers in the active layer 108. In this aspect, a maximum conduction band offset to the quantum wells confines electrons to the quantum wells. In accordance with embodiments, the doped cladding layers 104, 112 may be selected to have a high band gap in order to confine the injected carriers. For example, the doped cladding layers 104, 112 may have a higher bandgap energy than the adjacent barrier layers. In an embodiment, the barrier layers 106, 110 are $(Al_xGa_{1-x})_{0.5}In_{0.5}P$ alloys with $0.2 \le x \le 0.8$, such as $0.5 \le x \le 0.8$. In an embodiment, the doped cladding layers 104, 112 are $(Al_xGa_{1-x})_{0.5}In_{0.5}P$ alloys with $0.6 \le x \le 1.0$.

Figure 2:
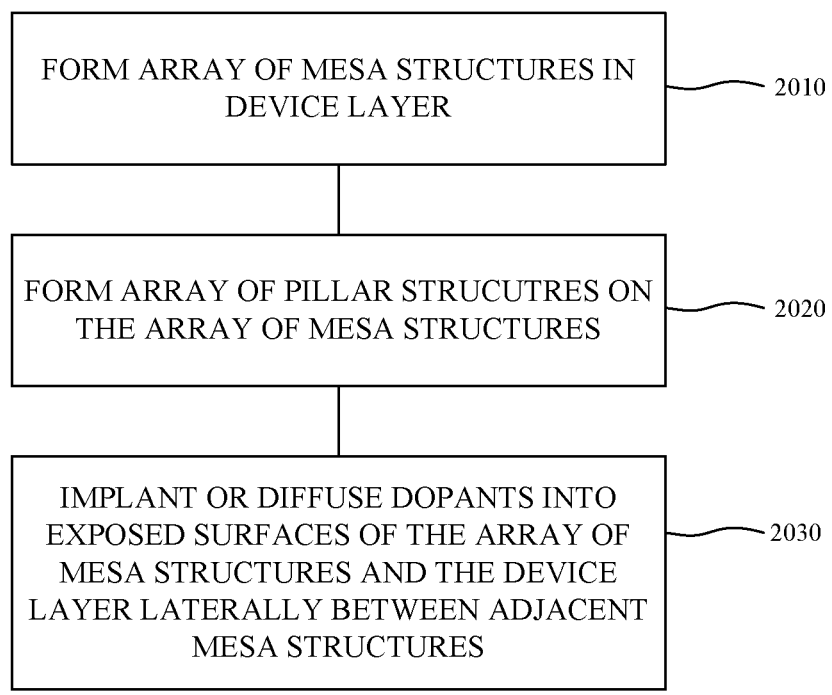
FIG. 2 is a flow chart illustrating a method of forming an LED including a pillar structure and surface doping in accordance with an embodiment.

Referring now to FIG. 2 a flow chart is provided of a method of forming an LED including a pillar structure and surface doping in accordance with an embodiment. In interest of clarity, the following description of FIG. 2 is made with regard to reference features found in other figures described herein. At operation 2010 an array of mesa structures 130 is formed in the device layer 117 of a bulk LED substrate 100. An array of pillar structures 140 is formed on the array of mesa structures 130 at operation 2020. At operation 2030 dopants are implanted or diffused into exposed surfaces of the array of mesa structures 130 and the device layer laterally between adjacent mesa structures to form confinement regions 150. In some embodiments, a mask used during etching of the pillar structures 140 may be subsequently used during implantation or diffusion at operation 2030. In accordance with embodiments, the order of operations 2010 and 2020 can be reversed.

In accordance with embodiments, locations of the dopant concentration profiles of confinement regions 150 are described as encroaching from the LED sidewalls or encroaching laterally above sidewalls of a pillar structure. Top conductive contacts are also described as being directly over the dopant concentration profiles of the confinement regions. It is to be appreciated that dopant concentration profiles due to implantation or diffusion could potentially cover a wide range of dopant profiles, that range from those that affect operation of the LED to those with negligible effect. Accordingly, in accordance embodiments the edges of the confinement regions 150 may be characterized by a threshold amount of dopant concentration, such as one that approaches or exceeds the nominal in-situ dopant concentration of the relative cladding layers 104, 112 or the n-dopant concentration in a modulated cladding layer. In an exemplary embodiment, a dopant concentration of $1\times10^{17}$ cm$^{-3}$ may approach the in-situ dopant concentration of the relative cladding layers 104, 112. In an exemplary embodiment, a dopant concentration greater than $1\times10^{18}$ cm$^{-3}$ may exceed the in-situ dopant concentration of the relative cladding layers 104, 112. In an exemplary embodiment, a dopant concentration greater than $5\times10^{17}$ cm$^{-3}$ may exceed the in-situ n– dopant concentration in a modulated cladding layer.

Figure 3:
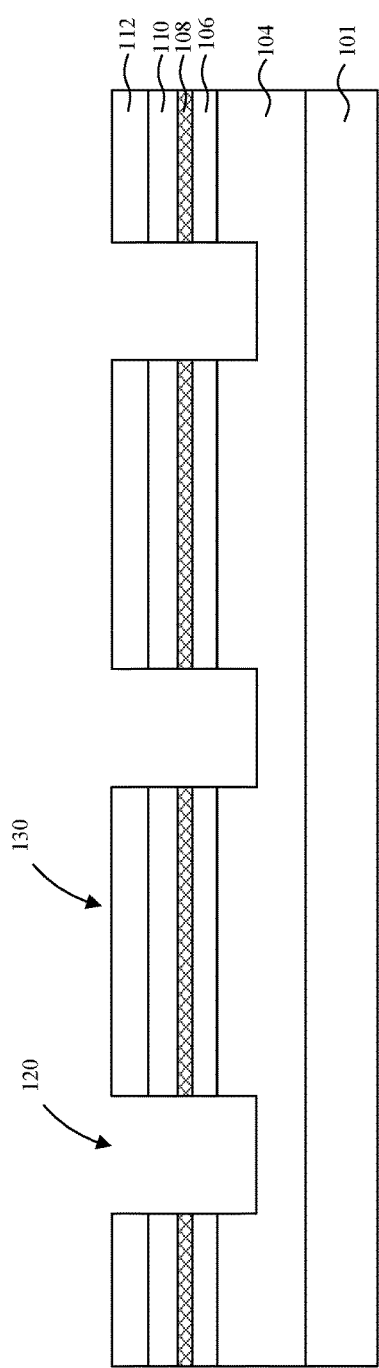
FIG. 3 is a schematic cross-sectional side view illustration of an array of mesa trenches and mesa structures formed in the device layer in accordance with an embodiment.

FIG. 3 is a schematic cross-sectional side view illustration of an array of mesa trenches 120 and mesa structures 130 formed in the device layer in accordance with an embodiment. In the particular embodiment illustrated contact layer 114, 102 are not separately illustrated. However, contact layers 114, 102 may be present similarly as described with regard to FIG. 1A. In the following description of FIGS. 3-15, processing of cladding layer 112 may include similar processing of contact layer 114 (not illustrated separately), and processing of cladding layer 104 may include similar processing of contact layer 102 (not separately illustrated). Accordingly, processing of cladding layer 112 may represent processing of doped (e.g. p-doped) cladding layer 112 and doped (e.g. p-doped) contact layer 114. Similarly, processing of cladding layer 104 may represent processing of doped (e.g. n-doped) cladding layer 104 and doped (e.g. n-doped) contact layer 102. In the particular embodiment illustrated in FIG. 3, mesa trenches 120 are formed at least partially through cladding layer 104. In an embodiment, mesa trenches 120 may be formed through cladding layer 104 and into (or stop on) contact layer 102. Alternatively, trenches may be formed completely through contact layer 102. As will become more apparent in the following description the width and depth of the mesa trenches 120 at least partially determines the dimensions of the LED bodies 132 (see FIGS. 12A-15) that will be formed.

Etching may be formed using a suitable technique such as wet etching or dry etching techniques. In an embodiment, mesa trenches 120 are formed by a first partial dry etch, then the wafer is transferred to an MOCVD chamber to complete etching of the mesa trenches 120. In this manner, the final etched surfaces are conditioned by etching in the MOCVD chamber and physical damage created during the dry etching operation is removed by the chemical etching in the MOCVD chamber. Exemplary dry etching techniques that may be used include reactive ion etching (RIE), electro-cyclotron resonance (ECR), inductively coupled plasma reactive ion etching (ICP-RIE), and chemically assisted ion-beam etching (CAIBE). The dry etching chemistries may be halogen based, containing species such as $Cl_2$, $BCl_3$, or $SiCl_4$. The etching chemistries within the MOCVD chamber may additionally be at an elevated temperature, such as 400° C.-700° C. The specific etching chemistry may include a combination of a corrosive etchant and a group V decomposition suppressant to stabilize the group V element, and suppress decomposition that may otherwise occur at the elevated etching temperature. In an embodiment, the etching chemistry includes a corrosive etchant such as HCl or $Cl_2$, and a group V decomposition suppressant such as $PH_3$. In an embodiment, the etching chemistry includes a corrosive etchant such as HCl, $Cl_2$, or $H_2$ (or combinations thereof), and a group V decomposition suppressant such as $NH_3$.

Figure 4:
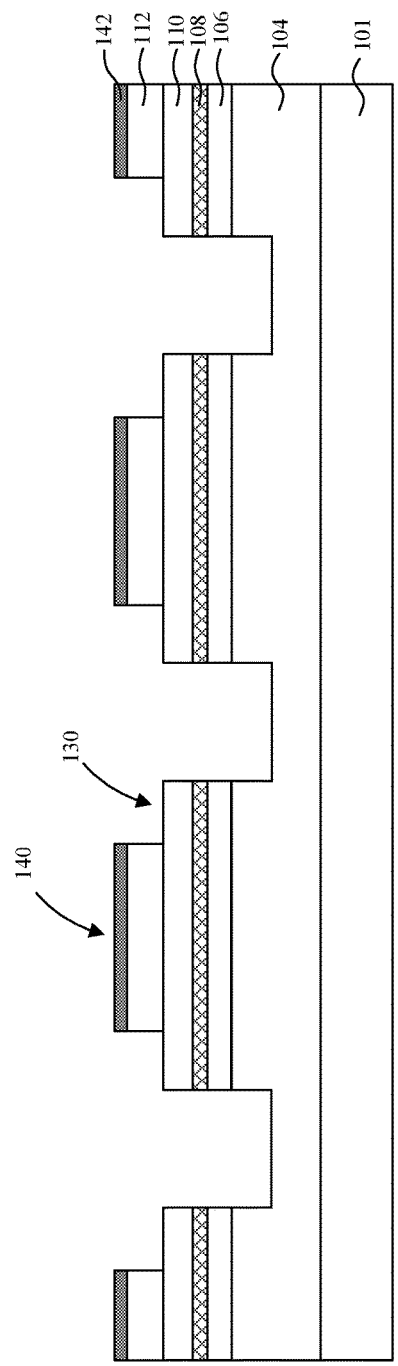
FIG. 4 is a schematic cross-sectional side view illustration of an array of pillar structures formed on an array of mesa structures in accordance with an embodiment.

In an embodiment, an array of pillar structures 140 are formed on the array of mesa structures 130, as illustrated in FIG. 4. The width of the pillar structures 140 may at least partially determine the ability to increase current density within the LED device as well as the ability to confine current internally within the LED device and away from the external sidewalls where non-radiative recombination may occur. In some embodiments, pillar structures 140 have a width or diameter of 1-10 µm, such as 2.5 µm. Pillar structures 140 may be formed using similar etching techniques used for mesa trenches 120. In an embodiment, mask layers 142 are used to pattern the pillar structures 140. Mask layers 142 may be formed with a dielectric material, such as $SiO_2$ that can survive the high temperatures and aggressive etch chemistries.

Referring now to FIGS. 5A-5B dopants are implanted or diffused into exposed surfaces of the array of mesa structures 130 and the device layer laterally between adjacent mesa structures to form confinement regions 150. In the embodiment illustrated in FIG. 5A, the confinement regions 150 have a shallow surface doping profile in which the vertical depth of the doping profile that extends from the top surface of the mesa structure 130 (which will become LED body 132 bottom surface 133) and stops before reaching the active layer 108. Thus, the shallow doping profile may stop within the barrier layer 110. In an embodiment, the barrier layer 110 is an unintentionally doped layer, less the doping from the confinement region 150. In the embodiment illustrated in FIG. 5B, the confinement regions 150 have a deep surface doping profile in which the vertical depth of the doping profile extends from the top surface of the mesa structure 130 (which will become LED body 132 bottom surface 133) and through the active region layer 108. In an embodiment, the vertical depth of the doping profile stops within the barrier layer 106. In an embodiment, the barrier layers 110, 106 are unintentionally doped layers, less the doping from the confinement region 150. In a specific embodiment, the confinement region 150 dopant is Zn (p-dopant).

In accordance with embodiments, the doping of confinement regions 150 may be n-type or p-type. In an embodiment, an element that produces a high doping concentration and low mobility is utilized. For example, this may be obtained if the acceptor or donor localization is relatively large (e.g. in order of 100 meV). In accordance with embodiments, low mobility of the confinement regions 150 due to relatively deep acceptor level inhibits strong current leakage. As a result, only minority carriers (e.g. electrons) may reach the LED surfaces, and hence the non-radiative surface recombination may be reduced. The p-doping near the LED surfaces may additionally screen away Fermi-level pinning if the p-dopant concentration is greater than $1 \times 10^{18}$ cm$^{-3}$.

Figure 5C:
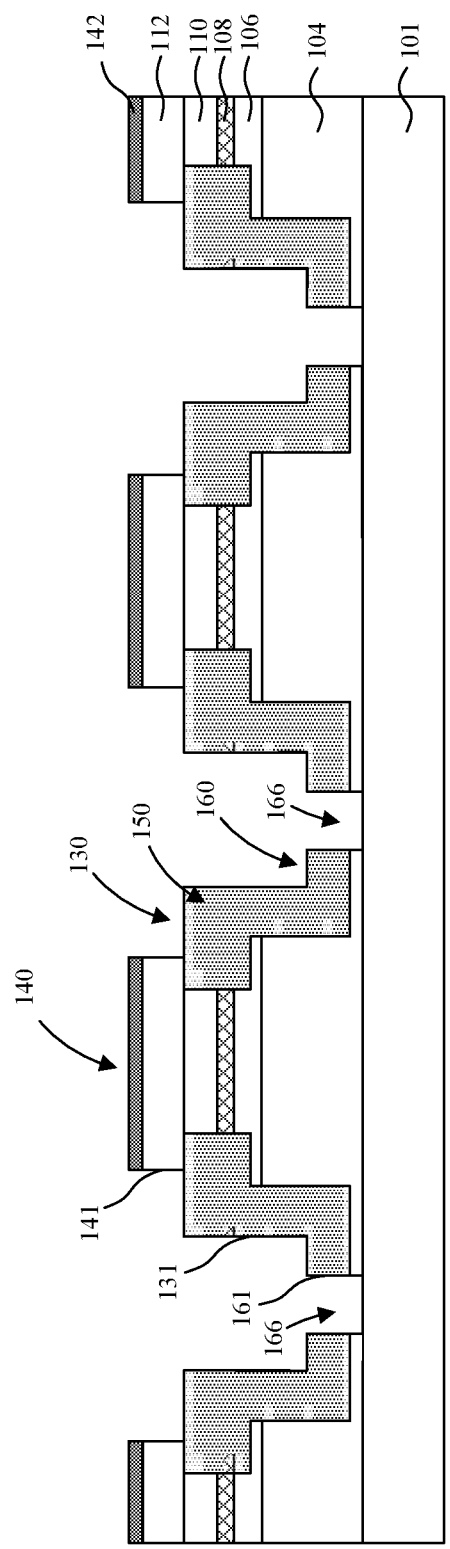
FIG. 5C is a schematic cross-sectional side view illustration of an array of trenches and top bases formed in the device layer in accordance with an embodiment.

Referring now to FIG. 5C in an embodiment an array of trenches and top bases 160 are formed in the device layer. In the particular embodiment illustrated in FIG. 5C, the trenches 166 may extend past the doping profile (shallow or deep) of the confinement region 150. For example, as illustrated in FIGS. 12B and 13B, this may aid in the formation of a passivation layer 170 along sidewalls 161 of the top base 160 of the LED.

FIG. 6 is a schematic cross-sectional side view illustration of a patterned passivation layer 170 is optionally formed over an array of pillar structures 140 and mesa structures 130 in accordance with an embodiment. The patterned passivation layer 170 in FIG. 6 is formed over the patterned LED substrate illustrated in FIG. 5B, however, embodiments are not so limited and a patterned passivation layer 170 can be formed over a variety of structures including those illustrated in FIG. 5A and FIG. 5C. In interests of clarity, and to not obscure embodiments, separate processing sequences are not illustrated forming a patterned passivation layer 170 on the structures illustrated in FIG. 5A or 5C.

In an embodiment, passivation layer 170 is formed of an electrically insulating material such as an oxide or nitride. In an embodiment, passivation layer 170 is approximately 50 angstroms to 3,000 angstroms thick $Al_2O_3$, and may be formed using a high quality thin film deposition process such as atomic layer deposition (ALD). As will become apparent in the following description a high quality thin film may protect the integrity of the passivation layer 170 during the sacrificial release layer etch operation. Openings 172 may be formed over the pillar structures 140 to expose the (bottom) surface 143 of the pillar structures 140, such as the (bottom) surface of the contact layer 114 or cladding layer 112.

Referring now to FIG. 7, an array of bottom conductive contacts 180 are formed on the bottom surfaces 143 of the array of pillar structures 140. Where the optional sidewall passivation layer 170 is present, the bottom conductive contacts 180 may be formed on the bottom surfaces 143 of the pillar structures and within the openings 172. The optional passivation layer 170 may additionally prevent shorting between the conductive contacts 180 and other areas of the LED, such as the mesa structures 130, which will become the LED bodies 132. Bottom conductive contacts 180 may include multiple layer stacks. Exemplary layers can include an electrode layer (e.g. to make ohmic contact with contact layer 114), mirror layer (e.g. nickel or silver), adhesion/barrier layer (e.g. titanium), diffusion barrier (e.g. platinum), and a bonding layer (such as gold) for bonding the completed LEDs to a receiving substrate.

Figure 8:
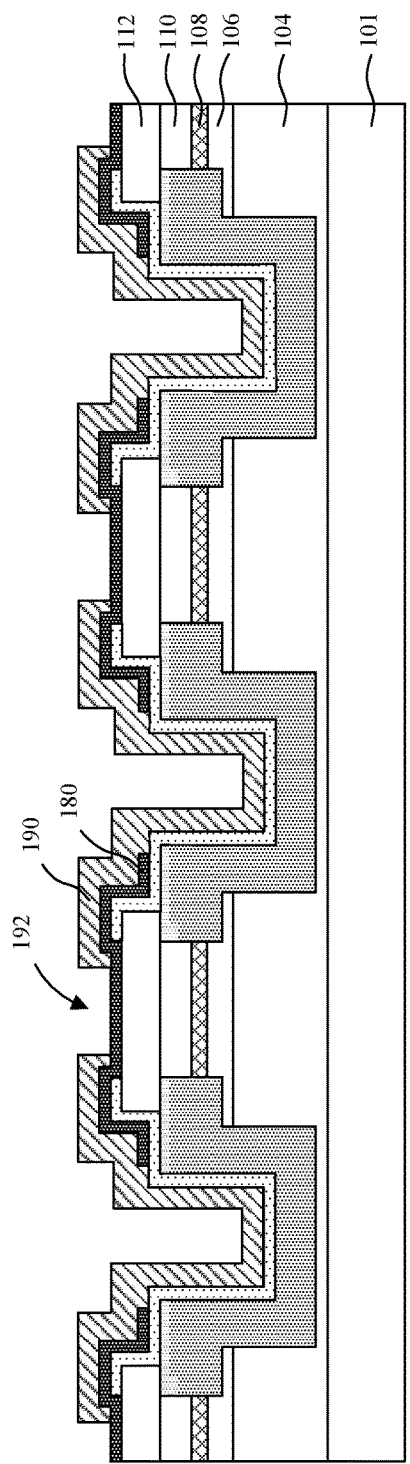
FIG. 8 is a schematic cross-sectional side view illustration of a patterned sacrificial release layer formed over the array of pillar structures and mesa structures in accordance with an embodiment.

Following the formation of the bottom conductive contacts 180, a sacrificial release layer 190 may be formed over the patterned device layer as illustrated in FIG. 8. The sacrificial release layer 190 may be patterned to form openings 192 over the bottom conductive contacts 180. The sacrificial release layer 190 may be formed of an oxide (e.g. $SiO_2$) or nitride (e.g. $SiN_x$), though other materials may be used which can be selectively removed with respect to the other layers. The height, width, and length of the openings 192 will correspond to the height, length, and width of the stabilization posts to be formed, and resultantly the adhesion strength that must be overcome to pick up the array of LEDs (e.g. micro LEDs) that are poised for pick up on the array of stabilization posts.

Figure 9:
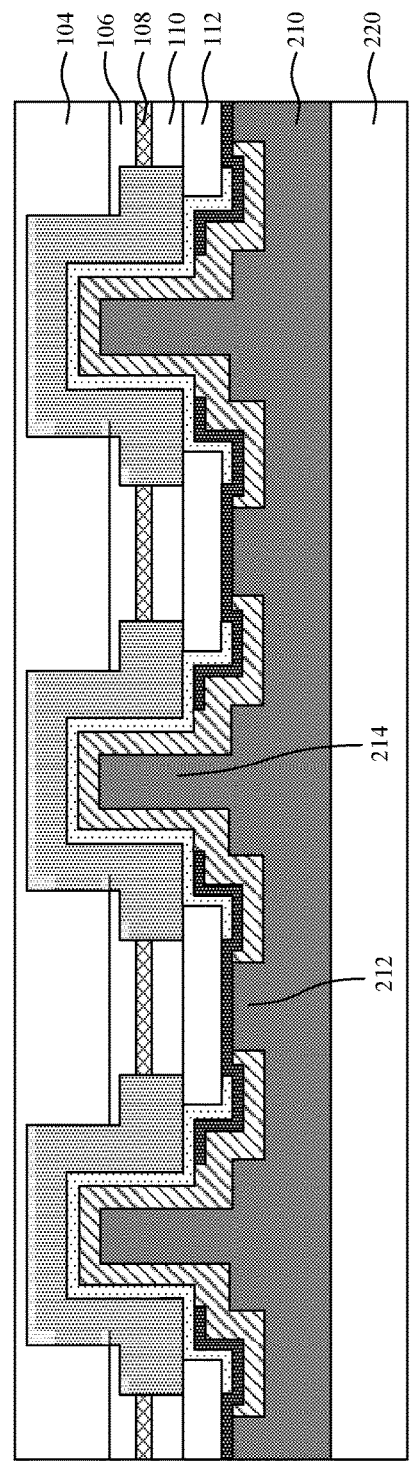
FIG. 9 is a schematic cross-sectional side view illustration of a patterned bulk LED substrate bonded to a carrier substrate with a stabilization layer in accordance with an embodiment.
Figure 10:
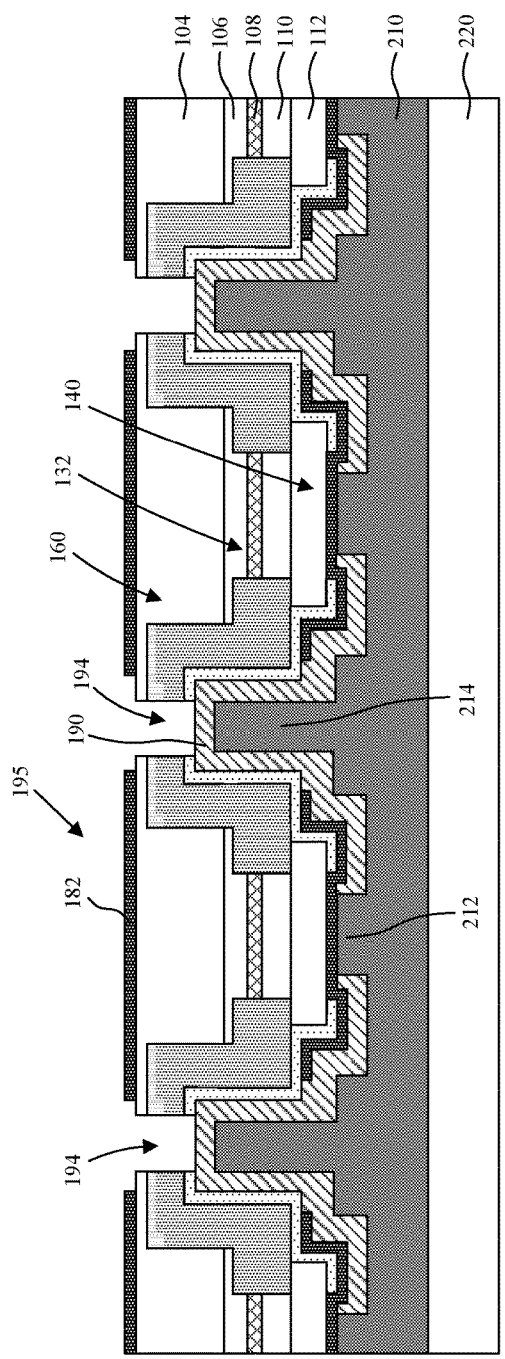
FIG. 10 is a schematic cross-sectional side view illustration of an array of LEDs including a top base, body, and pillar structure supported by an array of stabilization posts in accordance with an embodiment.
Figure 11:
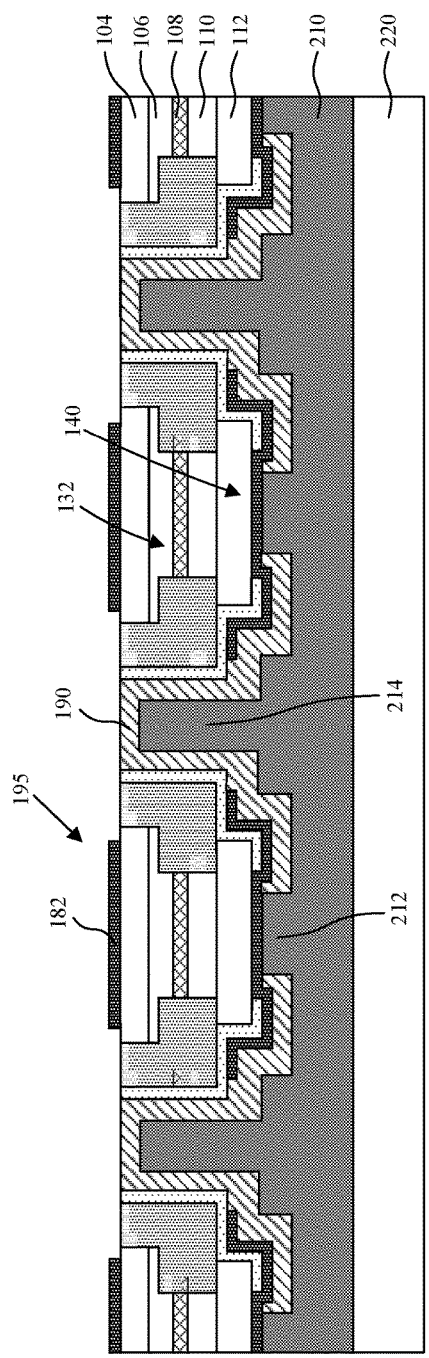
FIG. 11 is a schematic cross-sectional side view illustration of an array of LEDs including a body and pillar structure supported by an array of stabilization posts in accordance with an embodiment.

Referring now to FIG. 9, the patterned structure on the growth substrate 101 is bonded to a carrier substrate 220 with an adhesive bonding material to form stabilization layer 210. In an embodiment, the adhesive bonding material is a thermosetting material such as benzocyclobutene (BCB) or epoxy. The portion of the stabilization material that fills openings 192 corresponds to the stabilization posts 212 of the stabilization layer 210, and the portion of the stabilization material that fills the mesa trenches (and optionally base trenches) becomes the stabilization cavity sidewalls 214 of the stabilization layer 210.

After bonding to the carrier substrate 220, the growth substrate 101 may be removed utilizing a suitable technique such as laser lift-off, etching, or grinding to expose the device layer 117. Any remaining portions of the (n-doped) cladding layer 104 or (n-doped) contact layer 102 connecting the separate mesa structures 130 may then be removed using etching or grinding to form laterally separate p-n diodes. In the embodiment illustrated in FIG. 10, trenches 194 are etched through the device layer 117 to expose the sacrificial release layer 190. Formation of trenches 194 may result in the formation of top base 160, if not already formed. In the embodiment illustrated in FIG. 11, a thickness of the device layer 117 (e.g. contact layer 102 and/or cladding layer 104) is uniformly reduced to expose the sacrificial release layer 190. In the embodiment illustrated in FIG. 11, the thickness reduction may result in an LED without a top base 160. In an alternative embodiment in which trenches 166 were previously formed (e.g. FIG. 5C), the uniform thickness reduction may result in an LED with a top base 160.

A top conductive contact 182 may be formed over each laterally separate p-n diode resulting in LEDs 195, supported by stabilization posts 212 and embedded in a sacrificial release layer 190. Once ready for transfer to a receiving substrate, the sacrificial release layer 190 may be selectively removed, for example, with a vapor HF release operation. The LEDs 195 may then be poised for pick up and transfer to a receiving substrate, for example, with an electrostatic transfer head assembly including an array of electrostatic transfer heads.

FIGS. 12A-15 represent various LED structures that may be obtained in accordance with embodiments, including possible combinations of confinement region 150 dopant profiles, passivation layers 170, and presence of a top base 160 structure. In the embodiments illustrated, each of the LED 195 configurations include a pillar structure 140, and a doped current confinement region 150 along sidewalls of the LED. More specifically, each embodiment illustrated in FIGS. 12A-15 includes an LED body 132 that includes a top cladding layer 104 doped with a first dopant type (e.g. n-type), an active layer 108 below the top cladding layer 104, and a bottom barrier layer 110 below the active layer 108. A pillar structure 140 protrudes from a bottom surface 133 of the LED body 132, such as a bottom surface of the bottom barrier layer 110. The pillar structure 140 includes a bottom cladding layer 112 doped with a second dopant type (e.g. p-type) opposite of the first dopant type (e.g. n-type). Alternatively, the dopant types may be reversed. A confinement region 150 including a dopant concentration spans sidewalls 135 of the LED body 132 and the bottom surface 133 of the LED body 132 (e.g. bottom surface of the bottom barrier layer 110). In accordance with embodiments, the dopant concentration of the confinement region 150 is formed of the second dopant type (e.g. p-type, such as Mg, Zn) and encroaches from the LED body sidewalls 135 toward a center vertical axis 199 of the LED 195 and from the bottom surface 133 of the LED body 132 (e.g. bottom surface of the bottom barrier layer 110) toward the active layer 108. As illustrated, the dopant concentration also encroaches laterally (and directly) above sidewalls 141 of the pillar structure 140 within the bottom barrier layer 110 toward the center vertical axis 199 of the LED 195.

In each of the embodiments illustrated the confinement region 150 dopant concentration encroaches further toward the center vertical axis 199 of the LED 195 within the bottom barrier layer 110 than within the active layer 108 and the top cladding layer 104. For example, the confinement region 150 dopant concentration may be characterized as a Z-shape (e.g. FIGS. 12A-12B, 13A-13B) or L-shape (e.g. FIGS. 14-15). A Z-shape may include the L-shape.

A conformal passivation layer 170 may optionally be formed on and spanning the sidewalls 135 of the LED body 132, the sidewalls 141 of the pillar structure 140, and a bottom surface 143 of the pillar structure 140. An opening 172 may be formed in the conformal passivation layer 170 on the bottom surface 143 of the pillar structure, and a bottom conductive contact 180 formed on the bottom surface 143 of the pillar structure 140 and within the opening 172 of the conformal passivation layer 170.

Referring now to FIGS. 12A-12B and FIGS. 13A-13B in some embodiments, the LED 195 includes a top base 160, and the LED body 132 protrudes from a bottom surface 163 of the top base 160. As shown, the bottom surface 163 of the top base 160 is wider than the LED body 132, similarly as the bottom surface 133 of the LED body 132 is wider than the pillar structure 140 that protrudes from the bottom surface 133. In an embodiment, the confinement region 150 dopant concentration spans the bottom surface 163 of the top base, and encroaches toward a top surface 165 of the top base 160. The confinement region 150 dopant concentration may not encroach all the way to the top surface 165 of the top base 160. A top conductive contact 182 may be formed on the top surface 165 of the top base 160, and a bottom conductive contact 180 may be formed on the bottom surface 143 of the pillar structure 140.

Figure 12A:
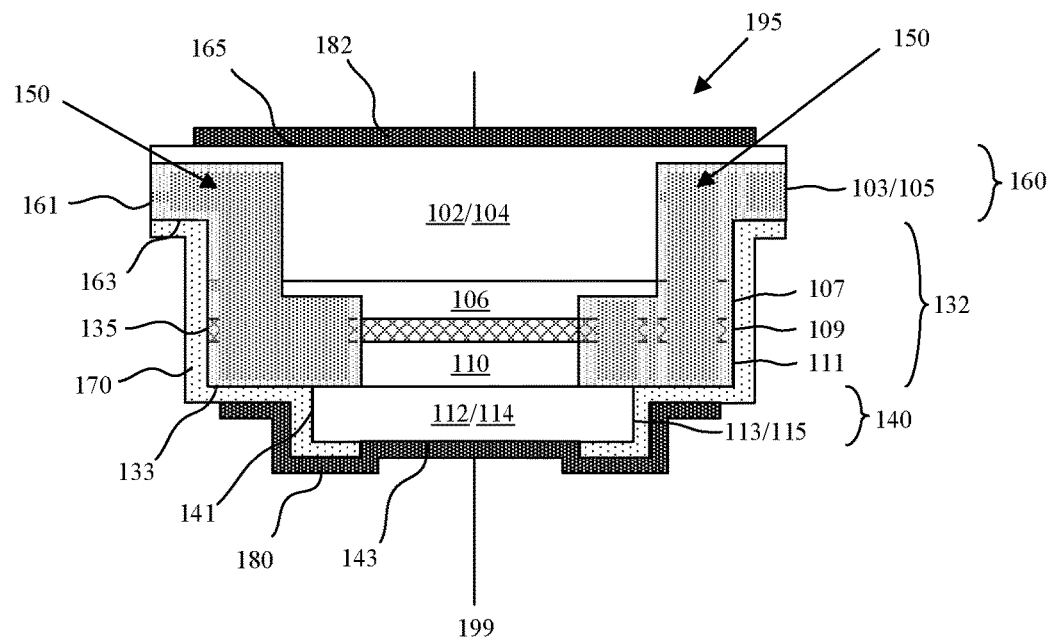
FIGS. 12A-12B are schematic cross-sectional side view illustrations of LEDs with a top base, body, pillar structure and a confinement region with a deep surface doping profile in accordance with embodiments.
Figure 12B:
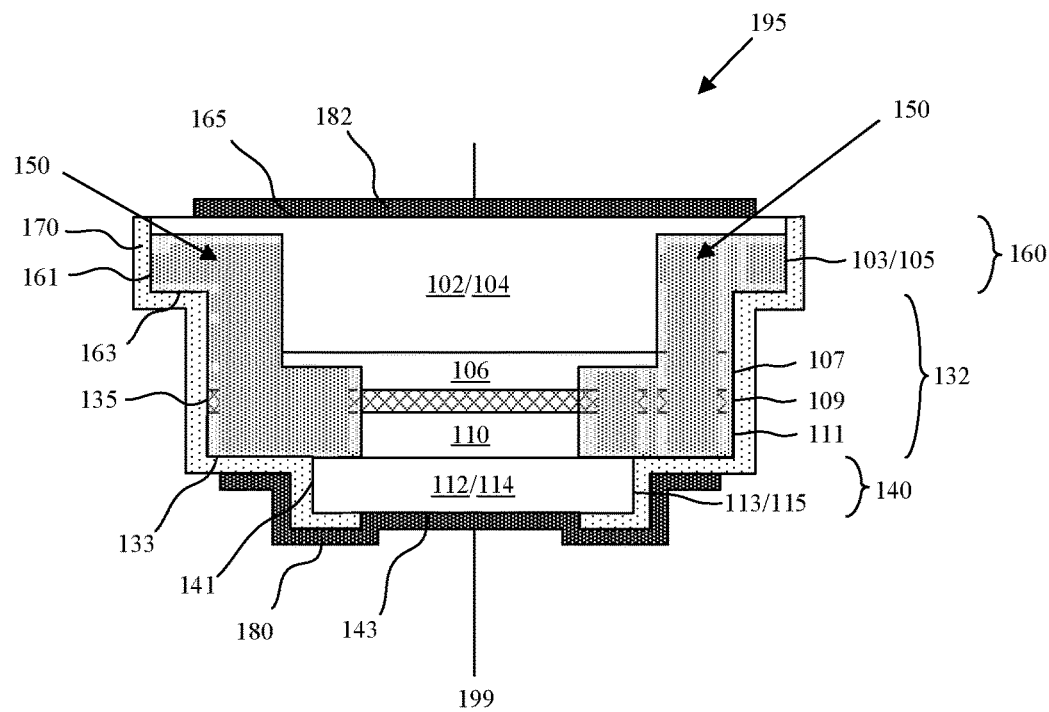

Referring to FIGS. 12A-12B, as described above with regard to FIG. 5B, the confinement region 150 dopant concentration may have a deep surface doping profile in which the vertical depth of the doping profile extends from the bottom surface 133 of the LED body 132 through the active region layer 108. In an embodiment, the vertical depth of the doping profile stops within the barrier layer 106. In an embodiment, the confinement region 150 dopant concentration encroaches further toward the center vertical axis 199 of the LED 195 within the bottom barrier layer 110 and the active layer 108 than within the top cladding layer 104. In an embodiment, the barrier layers 110, 106 are unintentionally doped layers, less the doping from the confinement region 150. In a specific embodiment, the confinement region 150 dopant is Zn (p-dopant).

Figure 13A:
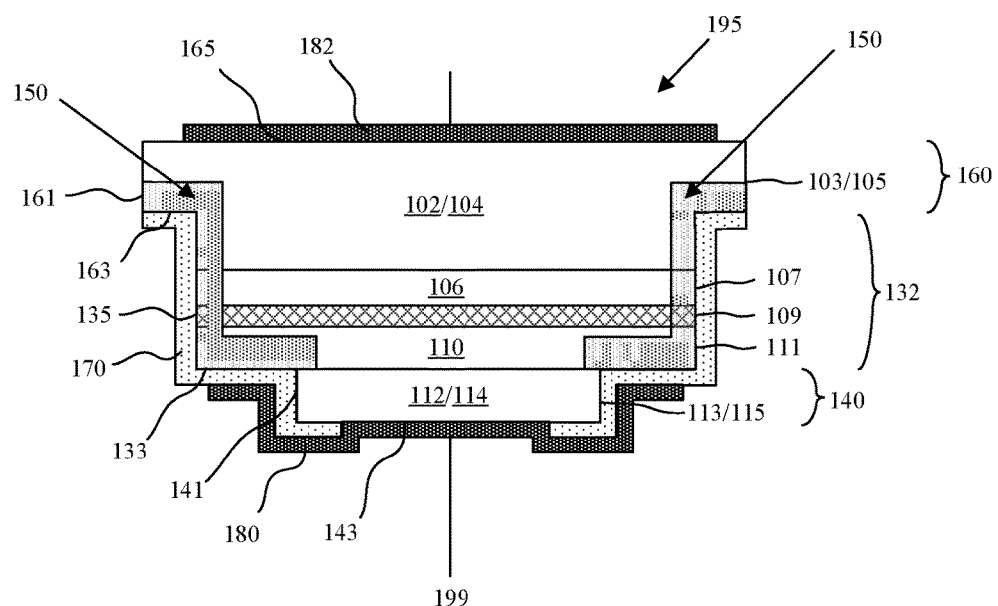
FIGS. 13A-13B are schematic cross-sectional side view illustrations of LEDs with a top base, body, pillar structure and a confinement region with a shallow surface doping profile in accordance with embodiments.
Figure 13B:
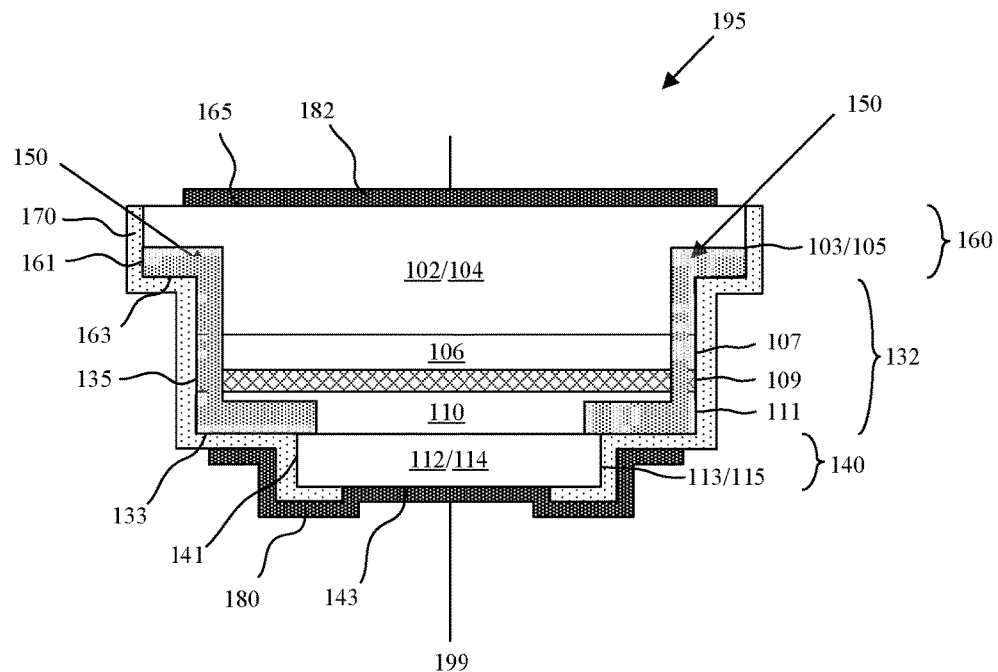

Referring to FIGS. 13A-13B, as described above with regard to FIG. 5A, the confinement region 150 dopant concentration may have a shallow surface doping profile in which the vertical depth of the doping profile extends from the bottom surface 133 of the LED body 132 and stops before reaching the active layer 108. Thus, the shallow doping profile may stop within the barrier layer 110. In an embodiment, the confinement region 150 dopant concentration encroaches further toward the center vertical axis 199 of the LED 195 within the bottom barrier layer 110 than within the active layer 108 and the top cladding layer 104. In an embodiment, the barrier layer 110 is an unintentionally doped layer, less the doping from the confinement region 150. In a specific embodiment, the confinement region 150 dopant is Zn (p-dopant).

Referring now to the embodiments illustrated FIGS. 12A and 13A, a conformal sidewall passivation layer 170 is illustrated as spanning along the bottom surface 143 of the pillar structure 140, sidewalls 135 of the LED body 132, and the bottom surface 163 of the top base 160. Referring now to FIGS. 12B and 13B, the conformal sidewall passivation layer 170 is additionally illustrated as also spanning the sidewalls 161 of the top base 160. The different structural configurations may be attributed to when the top base 160 is formed. For example, the top base 160 of FIGS. 12A and 13A may have been formed as described above with regard to FIG. 10, after the formation of the sidewall passivation layer 170 and bonding to the carrier substrate 220. The top base 160 of FIGS. 12B and 13B may have been formed as described above with regard to FIG. 5C, prior to the formation of the sidewall passivation layer 170.

The formation of a top base 160 may allow for relaxed alignment tolerances of the top conductive contacts 182. For example, in the embodiments illustrated in FIGS. 12A-12B and FIGS. 13A-13B, the area of the top surface 165 of the top base 160 is greater than the areas of the LED body 132 and pillar structure 140. Additionally, the confinement region 150 doping profiles may not extend to the top surface 165 of the top base 160. In an embodiment, were the top base 160 is n-doped, the pillar structure 140 is p-doped, and the confinement region 150 is p-doped, the vertical separation between the confinement region 150 and the top conductive contact 182 may function to prevent a p-doped shunt path along the LED sidewalls.

Figure 14:
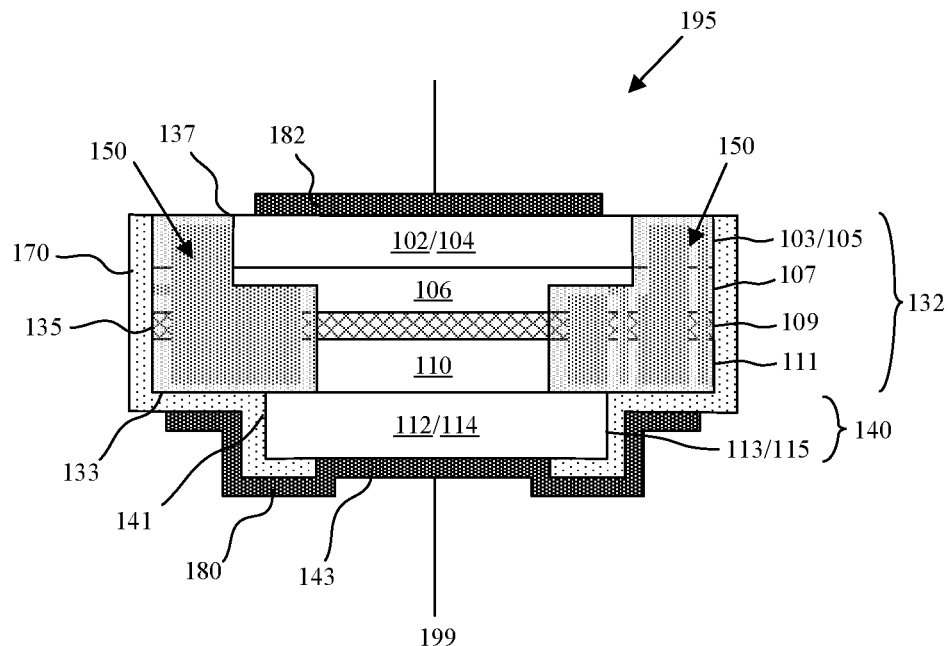
FIG. 14 is a schematic cross-sectional side view illustration of an LED with a body, pillar structure and a confinement region with a deep surface doping profile in accordance with an embodiment.
Figure 15:
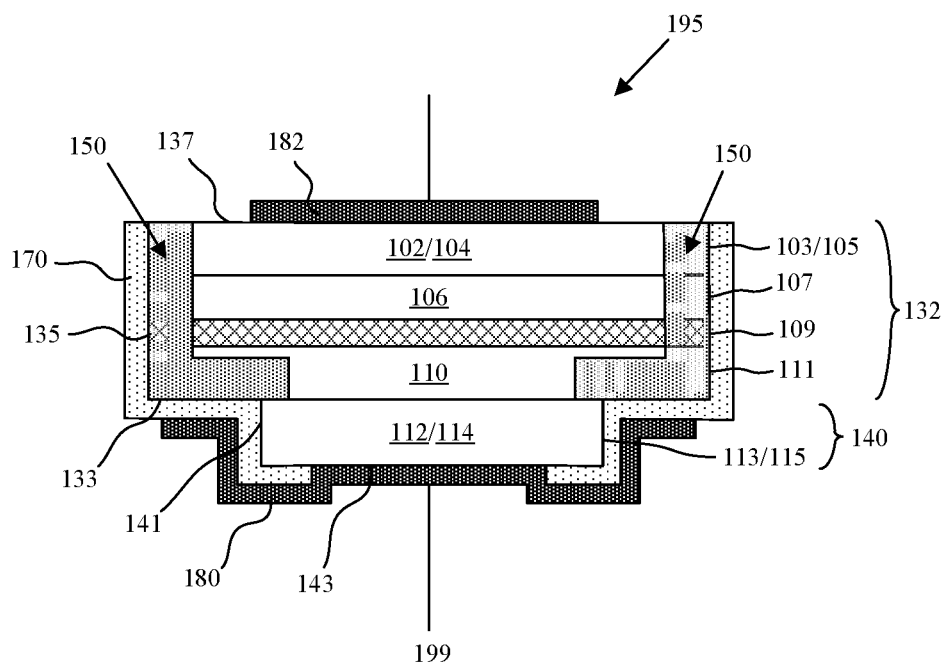
FIG. 15 is a schematic cross-sectional side view illustration of an LED with a body, pillar structure and a confinement region with a shallow surface doping profile in accordance with an embodiment.

Referring now to FIGS. 14-15 embodiments are illustrated in which the LEDs 195 do not include a top base layer 160. In the embodiment illustrated in FIG. 14 the confinement region 150 dopant concentration has a deep surface doping profile as previously described. In the embodiment illustrate din FIG. 15 the confinement region 150 dopant concentration has a shallow surface doping profile as previously described. In the particular embodiments illustrated in FIGS. 14-15, the confinement region 150 dopant concentration may extend to the top surface 137 of the LED body 132. In the embodiments illustrated, the top conductive contact 182 is not formed directly on the confinement region 150.

Figure 16:
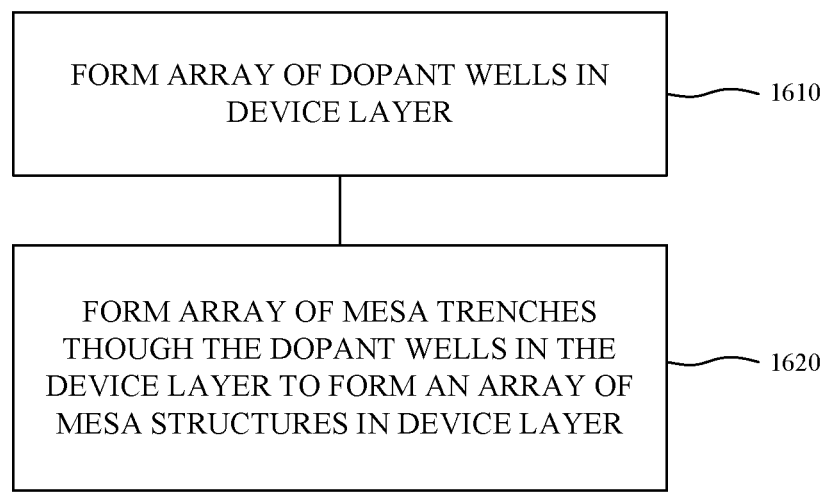
FIG. 16 is a flow chart illustrating a method of forming an LED including wafer level doping in accordance with an embodiment.

In some embodiments, the doping profiles of the confinement regions are formed at the wafer level prior to the formation of mesa structures. FIG. 16 is a flow chart illustrating a method of forming an LED including wafer level doping in accordance with an embodiment. In interest of clarity, the following description of FIG. 16 is made with regard to reference features found in other figures described herein. At operation 1610 an array of dopant wells 158 is formed in the device layer 117. Each dopant well 158 may optionally extend into a cladding layer 104 with modulated doping. At operation 1620 an array of mesa trenches 120 is formed in the array of dopant wells 158 in the device layer to form an array of mesa structures 130 including confinement regions 150 along sidewalls 131 of the mesa structures 130. In an embodiment, the confinement regions 150 overlap the cladding layers 104 with modulated doping to form n-p superlattices 159.

Figure 17:
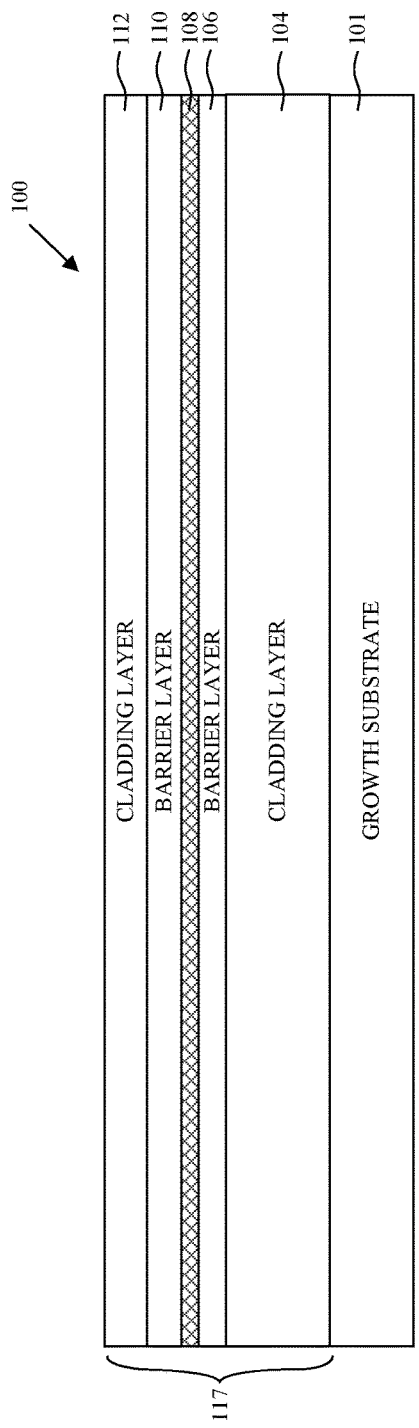
FIG. 17 is a schematic cross-sectional side view illustration of a bulk LED substrate in accordance with an embodiment.
Figure 18:
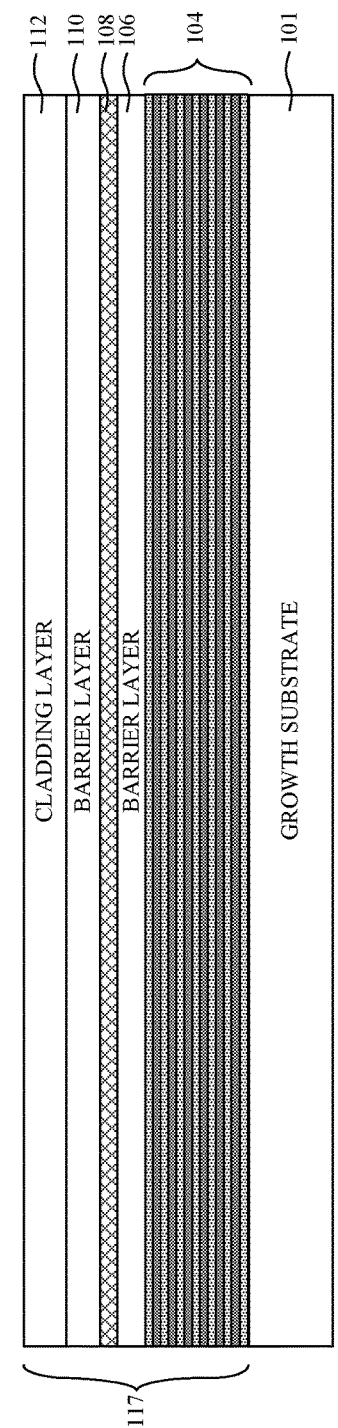
FIG. 18 is a schematic cross-sectional side view illustration of a bulk LED substrate including a cladding layer with modulated doping in accordance with an embodiment.

Referring now to FIG. 17 a schematic cross-sectional side view illustration is provided of a bulk LED substrate 100 in accordance with an embodiment. The bulk LED substrate 100 illustrated in FIG. 17 may be substantially similar to the bulk LED substrate illustrated and described with regard to FIG. 1A. Contact layers 102, 114 are not separately illustrated, though may be present similarly as described above. FIG. 18 is a schematic cross-sectional side view illustration of a bulk LED substrate including a cladding layer 104 with modulated doping in accordance with an embodiment. The bulk LED substrate 100 illustrated in FIG. 18 may be substantially similar to the bulk LED substrate illustrated and described with regard to FIG. 17, with one difference being the cladding layer 104 with modulated doping. Contact layers 102, 114 are not separately illustrated, though may be present similarly as described above.

FIGS. 19A-19B are schematic cross-sectional side view illustrations of dopant wells 158 formed in bulk LED substrates in accordance with embodiments. In the embodiment illustrated in FIG. 19A the dopant wells 158 extend into and terminate in the cladding layer 104. In the embodiment illustrated in FIG. 19B the dopant wells 158 extend through the cladding layer 104. Dopant wells 158 may be formed using techniques such as implantation, solid source diffusion, or vapor diffusion. In an embodiment dopant wells 158 are p-type, and include a dopant profile of a dopant such as a Zn or Mg. As will become apparent in the following description, the dopant wells 158 may displace the p-n junction.

Figure 19C:
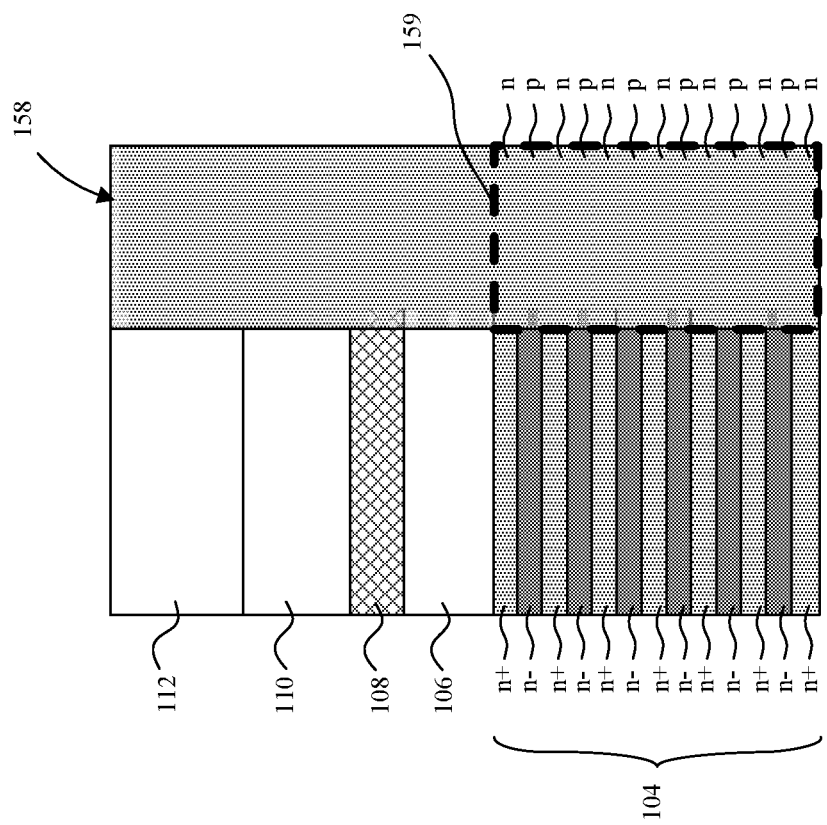
FIG. 19C is a close up schematic cross-sectional side view illustration of an n-p superlattice where a dopant well overlaps a cladding layer with modulated doping in accordance with an embodiment.

In the particular embodiments illustrated in FIGS. 19A-19B cladding layer 104 includes modulated doping. In some embodiments, cladding layer 104 is similar to cladding layer 104 described above with regard to FIG. 17. Referring now to FIG. 19C a close up schematic cross-sectional side view illustration is provided of an n-p superlattice 159 where a dopant well 158 overlaps a cladding layer 104 with modulated doping in accordance with an embodiment. In the particular embodiment illustrated, the cladding layer 104 includes modulated n-type doping between a high value (e.g. n+) and a low value (e.g. n−). In an embodiment the high value (e.g. n+) is chosen to be sufficiently high to remain n-type after diffusion of the dopant well 158 (e.g. Zn diffusion), so that the region is not fully compensated by the Zn; while the low value (e.g. n−) is chosen to be converted to p-type by the dopant well 158 diffusion (e.g. Zn diffusion). For example, if the dopant well 158 includes a dopant concentration (e.g. Zn) of about $1\times10^{18}$ cm$^{-3}$, the n+ regions may be doped at a level above this, and with a significant margin to ensure reproducibility, such as greater than or equal to $2\times10^{18}$ cm$^{-3}$. Likewise, the n− regions may have a donor concentration less than the (Zn) dopant well 158 concentration, such as $5\times10^{17}$ cm$^{-3}$. In an embodiment, at these exemplary donor concentrations the Zn diffusion converts the n-regions to p-type, while the n+ regions remain n-type, and an n-p superlattice 159 is created.

Figure 20A:
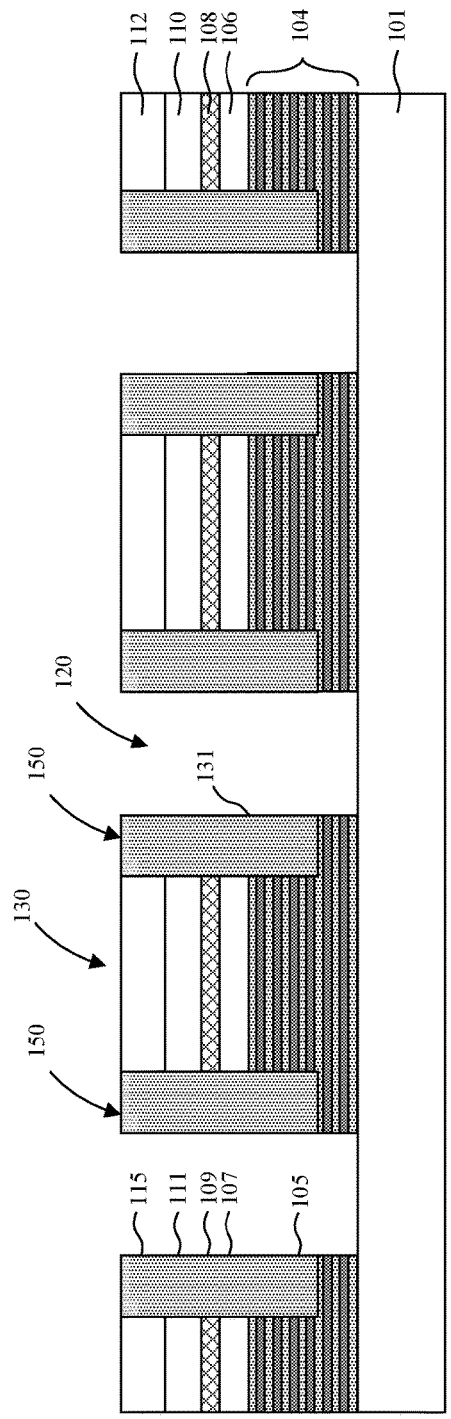
FIGS. 20A-20B are schematic cross-sectional side view illustrations of an array of mesa trenches and mesa structures formed in a device layer in accordance with embodiments.
Figure 20B:
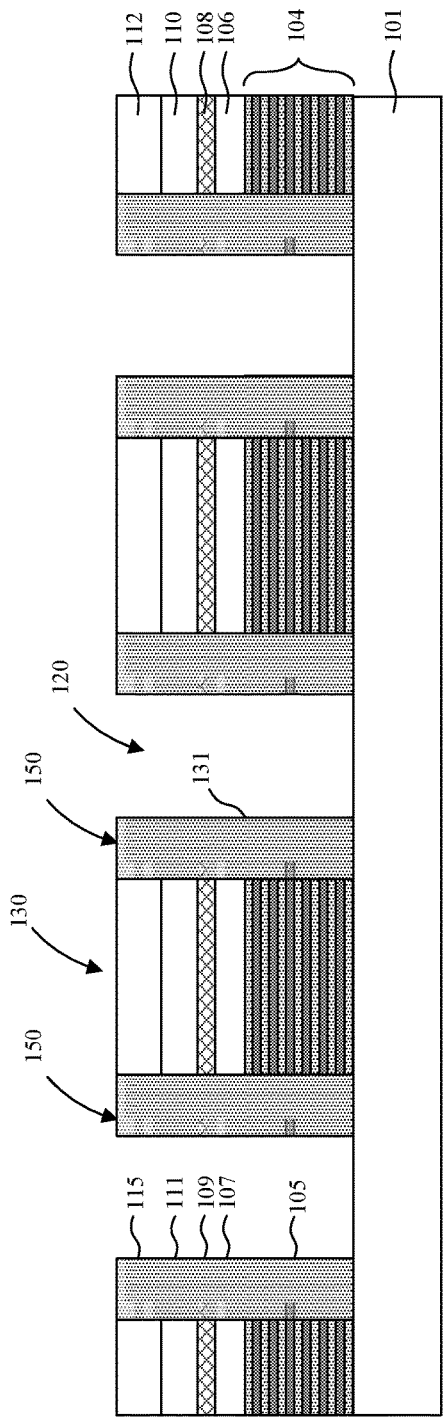

FIGS. 20A-20B are schematic cross-sectional side view illustrations of an array of mesa trenches 120 and mesa structures 130 formed in the device layer in accordance with embodiments. As shown the mesa trenches 120 may be formed through the dopant wells, resulting in confinement regions 150 along sidewalls 131 of the mesa structures 130. In accordance with embodiments, the mesa structures 130 will become LED bodies 132, and sidewalls 131 of the mesa structures will become sidewalls 135 of the LED bodies 132. In the embodiment illustrated in FIG. 20A, the mesa trenches 120 may be formed vertically below the dopant wells, and resultant confinement regions 150. In the embodiment illustrated in FIG. 20B, the mesa trenches 120 may be formed completely through the cladding layer 104.

Figure 21A:
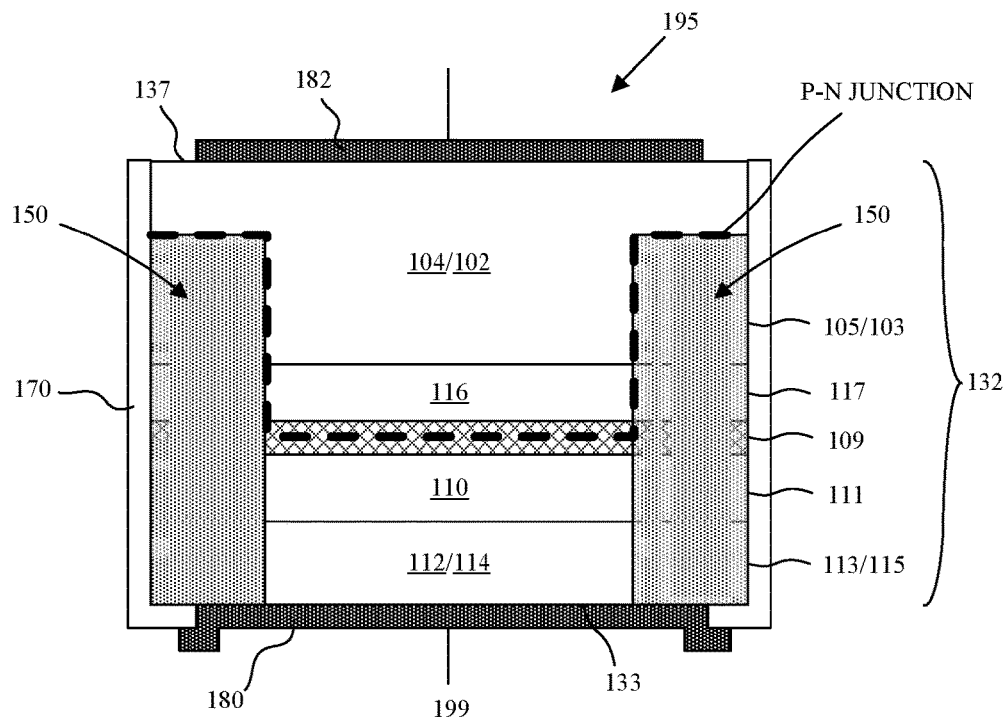
FIGS. 21A-21B are schematic cross-sectional side view illustrations of LEDs including doped sidewalls in accordance with embodiments.
Figure 21B:
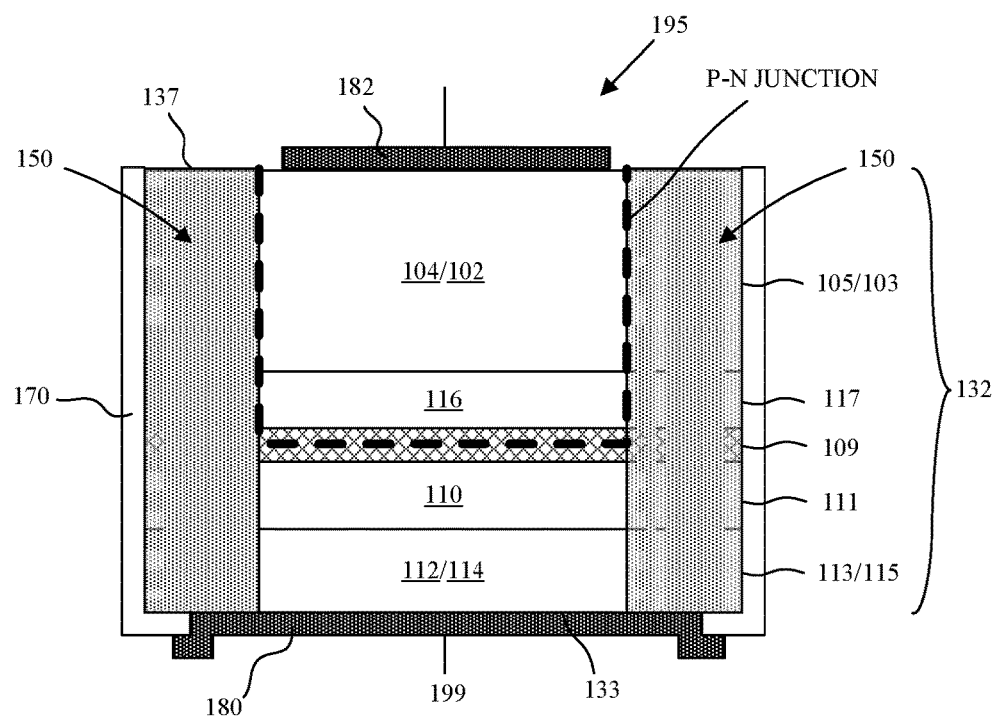
Figure 22A:
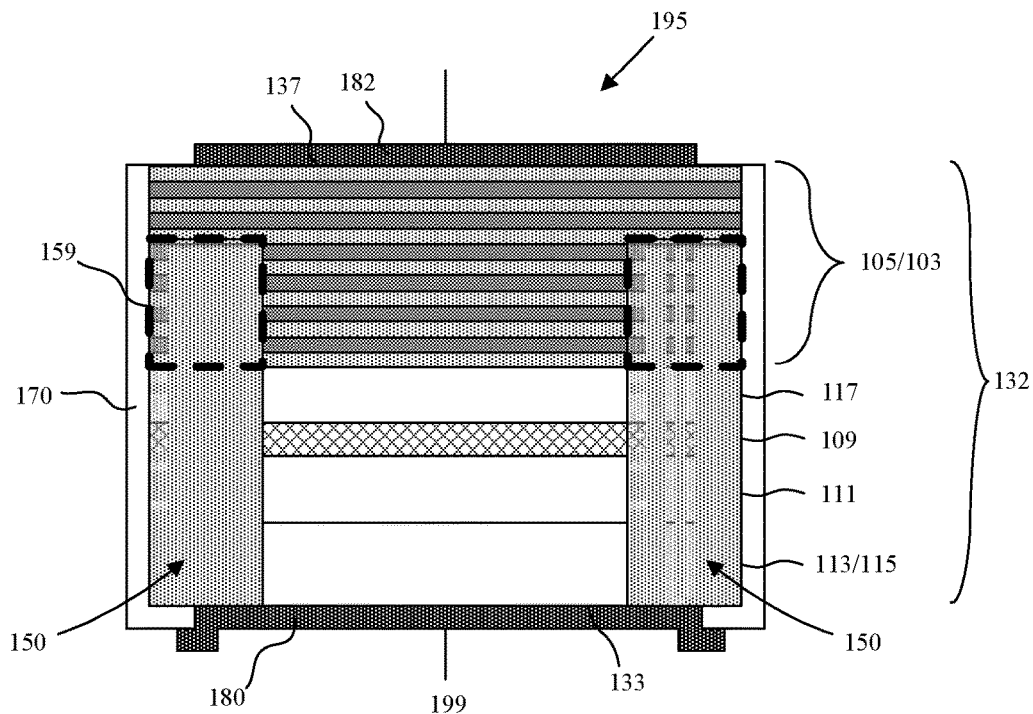
FIGS. 22A-22B are schematic cross-sectional side view illustrations of LEDs including n-p superlattices along the LED sidewalls in accordance with embodiments.
Figure 22B:
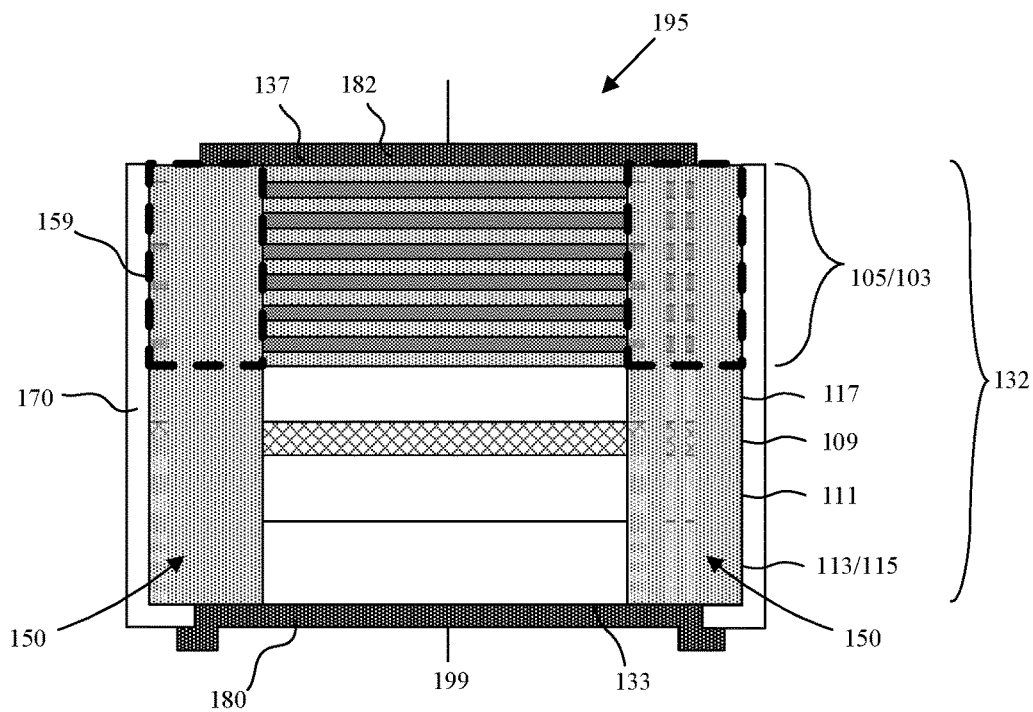

Following the formation of mesa structures 130, the patterned bulk LED substrates of FIGS. 20A-20B may be processed similarly as illustrated and described above with regard to FIGS. 6-11 to form an array of LEDs 195 that are poised for pick up and transfer to a receiving substrate. FIGS. 21A-21B are schematic cross-sectional side view illustrations of LEDs 195 including doped sidewalls in accordance with embodiments. In particular the LEDs 195 illustrated in FIGS. 21A-21B may be formed utilizing the bulk LED substrate 100 illustrated in FIG. 17. FIGS. 22A-22B are schematic cross-sectional side view illustrations of LEDs 195 including n-p superlattices 159 along the LED sidewalls in accordance with embodiments. In particular the LEDs 195 illustrated in FIGS. 22A-22B may be formed utilizing the bulk LED substrate 100 illustrated in FIG. 18.

As illustrated, the LEDs 195 include an LED body 132 which includes a top cladding layer 104 doped with a first dopant type (e.g. n-type), an active layer 108 below the top cladding layer 104, and a bottom cladding layer 112 below the active layer 108. The bottom cladding layer 112 may be doped with a second dopant type (e.g. p-type) opposite the first dopant type. A confinement region 150 including a dopant concentration (e.g. p-dopant such as Mg or Zn) spans sidewalls 105 of the top cladding layer 104, sidewalls 109 of the active layer 108, and sidewalls 113 of the bottom cladding layer 112, and the dopant concentration encroaches from the sidewalls 105, 109, 113 toward a center vertical axis 199 of the LED 195. In an embodiment, the confinement region 150 dopant concentration does not extend to a top surface of the top cladding layer 104. In the embodiment illustrated in FIG. 21A a p-n junction may exist at the sidewalls 105 of the top cladding layer 104. In such a configuration, the alignment tolerance is relaxed for the top conductive contact 182, which may be formed directly over the confinement region 150. In the embodiment illustrated in FIG. 21B a p-n junction may exist at the top surface 137 of the LED body 132. In such a configuration, the confinement region 150 dopant concentration may extend to the top surface 137 of the LED body 132. In the embodiment illustrated, the top conductive contact 182 is not formed directly on the confinement region 150 in order to avoid the formation of a shunt path along sidewalls of the LED body 132.

In a conventional LED the p-n junction extends laterally across the active layer to sidewalls of the active layer/LED. It has been observed that mid-gap electronic states associated with unsatisfied bonds and/or crystal damage at the surface may be responsible for non-radiative recombination and diode leakage current. In accordance with embodiments, a confinement region 150 adjacent sidewalls of the LED suppresses non-radiated recombination. In the embodiments illustrated in FIGS. 21A-22B, the confinement region 150 dopant (e.g. Zn) concentration converts the n-type materials to p-type, and the active region p-n junction is displaced from the active layer. In the embodiment illustrated in FIG. 21A the p-n junction has been shifted into the cladding layer 104. In the embodiment illustrated in FIG. 21B the p-n junction has been shifted to the top surface 137 of the LED body 132. Mid-gap electronic states associated with unsatisfied bonds and/or crystal damage at the LED sidewalls of the exposed p-n junction may still be responsible for non-radiative surface recombination and diode leakage at the exposed p-n junctions of FIGS. 21A-21B.

In the embodiments illustrated in FIGS. 22A-22B the top cladding layer 104 includes modulated doping. For example, the top cladding layer 104 may include alternating n-regions and n+ regions on top of one another. In an embodiment, the n− regions have an n-dopant concentration less than the p-dopant concentration in the portion of the confinement region 150 overlapping the n− regions. In an embodiment, the n+ regions have an n-dopant concentration greater than the p-dopant concentration in the portion of the confinement region 150 overlapping the n+ regions.

Several conditions may apply in the n-p super lattice 159. 1) In one embodiment, both the p-type and n-type layers are fully depleted of free carriers by the back-to-back p-n junctions. In this case, the doping and thickness of each layer is insufficient to fully accommodate the depletion from adjacent layers. The n-p superlattice 159 becomes depleted of free carriers. 2) In one embodiment, one or both of the layers in the n-p super lattice 159 is depleted, and the second type is not. In this case, one of the layers is not sufficiently thick enough to accommodate depletion from adjacent layers. For the second layer type, the thickness is sufficient to accommodate the depletion, so that free carriers exist in the second layer type. 3) In one embodiment, both layers are not depleted, that is each is sufficiently thick to accommodate the depletion. In this case, the n-p super lattice 159 alternating n-p junctions serve to block current.

Accordingly, the modulated doping structure may modify the LED sidewall carrier-concentration profile. The extended depletion region or back-to-back p-n junctions along the LED sidewall may be employed to 1) control the size of the electrically-injected region, i.e. achieve some current confinement, 2) minimize leakage current associated with the parasitic exposed p-n junction formed by the confinement region 150, 3) minimize non-radiative recombination at the LED sidewalls, and 4) relax the alignment tolerance for the top conductive contact 182.

In the embodiment illustrated in FIG. 22A the confinement region 150 dopant concentration does not extend to the top surface 137 of the LED body 132. In such a configuration, the alignment tolerance is relaxed for the top conductive contact 182, which may be formed directly over the confinement region 150. In the embodiment illustrated in FIG. 22B the confinement region 150 dopant concentration may optionally extend to the top surface 137 of the LED body 132. In such an embodiment, the top conductive contact 182 may also be formed directly over the confinement region 150, with the n-p superlattice inhibiting a shunt path along the LED sidewalls. In some embodiments, the top conductive contact 182 is not formed directly over the confinement region 150.

Up until this point the bulk LED substrates 100 and LEDs have been described with regard to, but not limited to, AlInGaP material systems specifically. In other embodiments, the bulk LED substrates and LEDs may correspond to blue emitting (e.g. 450-495 nm wavelength), green emitting (e.g. 495-570 nm wavelength) systems, or deep blue emitting systems, for example. Referring now to FIGS. 37A-37E schematic cross-sectional side view illustrations are provided of a method of forming LEDs including forming an array of mesa trenches and mesa structures in accordance with embodiments.

FIG. 37A is a cross-sectional side view illustration of an simplified bulk LED substrate 400, in which more layers may be present than those illustrated. As illustrated, the bulk LED substrate 400 includes a growth substrate 401, a doped semiconductor layer 404 (e.g. n-doped) an active region 408 on the doped semiconductor layer 404, and a doped semiconductor layer 412 (e.g. p-doped) on the active region 408. By way of example, in an embodiment, the bulk LED substrate 400 is designed for emission of blue or green light, and the materials are nitride based. The followed listing of materials for blue or green emission is intended to be exemplary and not limiting. For example the layers forming the doped semiconductor layers 404, 412 may include GaN, AlGaN, InGaN. Active region 408 may be formed of a variety of materials, such as but not limited to InGaN. In such an embodiment, a suitable growth substrate 401 may include, but is not limited to, silicon and sapphire.

In interests of clarity, in the following descriptions related to bulk LED substrates 400, reference to features similar to those described with regard to processing of the bulk LED substrates 100 will be made using like reference numbers, for example, with reference number 400 corresponding substantially to reference number 100. Additionally, it is understood that the illustrated bulk LED substrates 400 are simplified. For example, doped semiconductor layer 404 may include multiple layers, such as a contact layer, cladding layer, and/or barrier layer. Similarly, doped semiconductor layer 412 may include multiple layers, such as a barrier layer, cladding layer, and contact layer.

Referring now to FIGS. 37B-37C, a bottom conductive contact 480 is formed over the doped semiconductor layer 412, followed by the formation of a mask layer 442, and the implantation of ions to form an array of dopant wells 458. Exemplary ions include Al, Mg, and Si though others elements may be suitable.

Following the formation of dopant wells 458, the mask layer 442 may be removed as illustrated in FIG. 37D, and mesa trenches 420 formed through the dopant wells 458 as illustrated in FIG. 37E, forming confinement regions 450. In accordance with embodiments, the confinement regions 450 may function as a current aperture to keep the current away from high damage regions that may have been caused during etching (e.g. plasma etching) of the mesa trenches 420. Following additional processing, the resulting LEDs may be similar to those illustrated and described with regard to FIGS. 21A-22B.

In an embodiment, the LED structure includes an LED body with a top doped semiconductor layer 404 doped with a first dopant type (e.g. n-type), an active region 408 below the top doped semiconductor layer 404, a bottom doped semiconductor layer 412 doped with a second dopant type (e.g. p-type) opposite the first dopant type, and a confinement region 450 including a dopant concentration spanning sidewalls of the top doped semiconductor layer 404, the active region 408, and the bottom doped semiconductor layer 412, wherein the dopant concentration encroaches from the sidewalls of the top doped semiconductor layer 404, the active region 408, and the bottom doped semiconductor layer 412 toward a center vertical axis of the LED. In an embodiment, the dopant concentration is formed of a dopant such as Al, Mg, and Si. In an embodiment, the dopant concentration does not extend to a top surface of the top doped semiconductor layer 404.

In an embodiment, the LED additionally includes a p-n junction on the sidewalls of the top doped semiconductor layer 404. In an embodiment, top doped semiconductor layer 404 includes alternating n-regions and n+ regions on top of one another. For example, the n− regions may have an n-dopant concentration less than the dopant concentration (e.g. Al, Mg, and Si) in the portion of the dopant concentration overlapping the n− regions. In an embodiment, the n+ regions have an n-dopant concentration greater than the p-dopant concentration in the portion of the dopant concentration overlapping the n+ regions.

Figure 23:
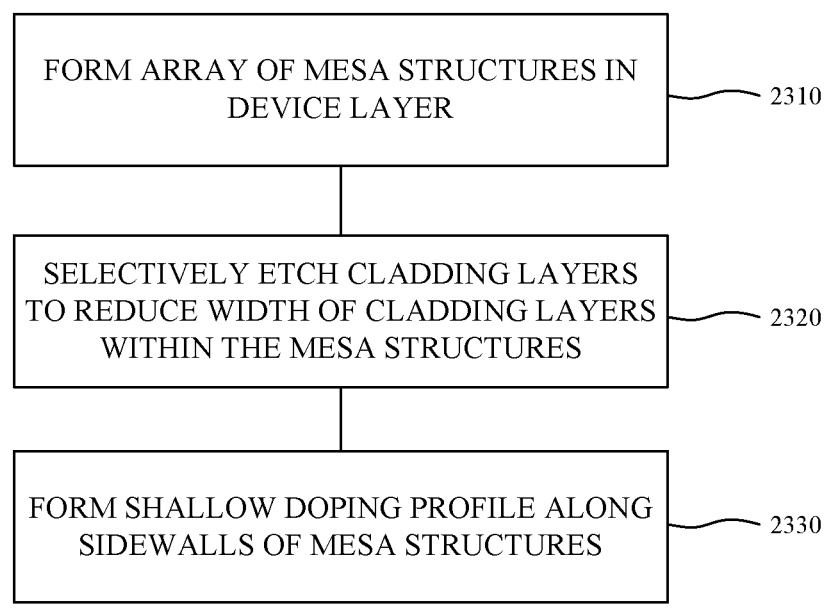
FIG. 23 is a flow chart illustrating a method of forming an LED including selective etching of the cladding layers and shallow doping in accordance with an embodiment.

Referring now to FIG. 23 a flow chart is provided illustrating a method of forming an LED including selective etching of the cladding layers and shallow doping in accordance with an embodiment. In interest of clarity, the following description of FIG. 23 is made with regard to reference features found in other figures described herein. At operation 2310 an array of mesa structures 130 is formed in the device layer 117 of a bulk LED substrate 100. At operation 2320 the cladding layers 104, 112 are then selectively etched to reduce the respective widths of the cladding layers 104, 112 within the mesa structures 130. At operation 2330 confinement region 150 shallow doping profiles are formed along sidewalls 131 of the mesa structures 130.

Figure 24:
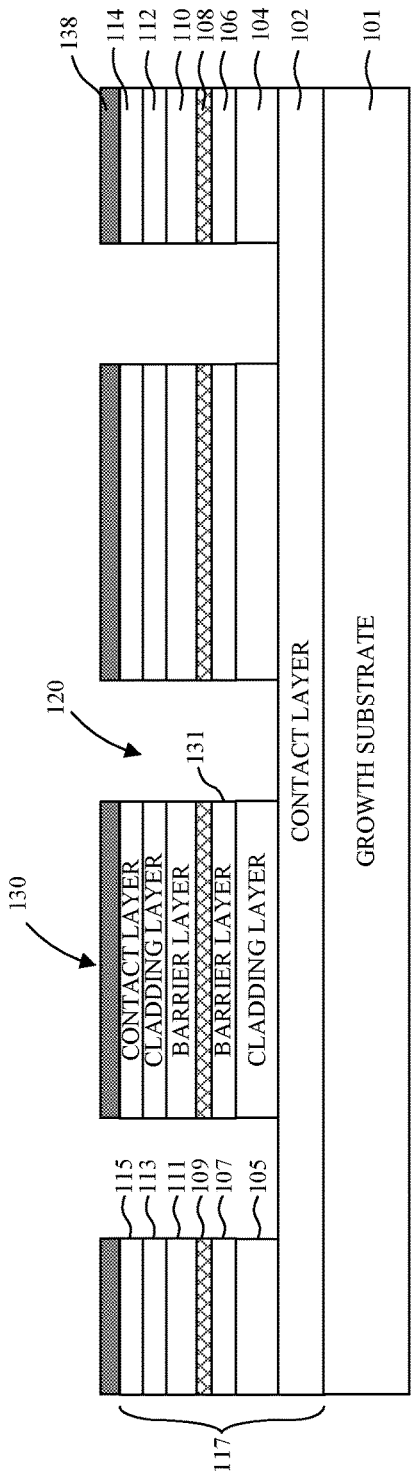
FIG. 24 is a schematic cross-sectional side view illustration of an array of mesa trenches and mesa structures formed in a device layer in accordance with an embodiment.

Referring now to FIG. 24 a schematic cross-sectional side view illustration is provided of an array of mesa trenches 120 and an array of mesa structures 130 formed in a device layer 117 in accordance with an embodiment. The bulk LED substrate 100 illustrated in FIG. 24 may be substantially similar to the bulk LED substrate illustrated and described with regard to FIG. 1A. In the particular embodiment illustrated, mesa trenches 120 stop on or within the contact layer 102. In another embodiment, mesa trenches 120 may be formed through the contact layer 102.

Figure 25:
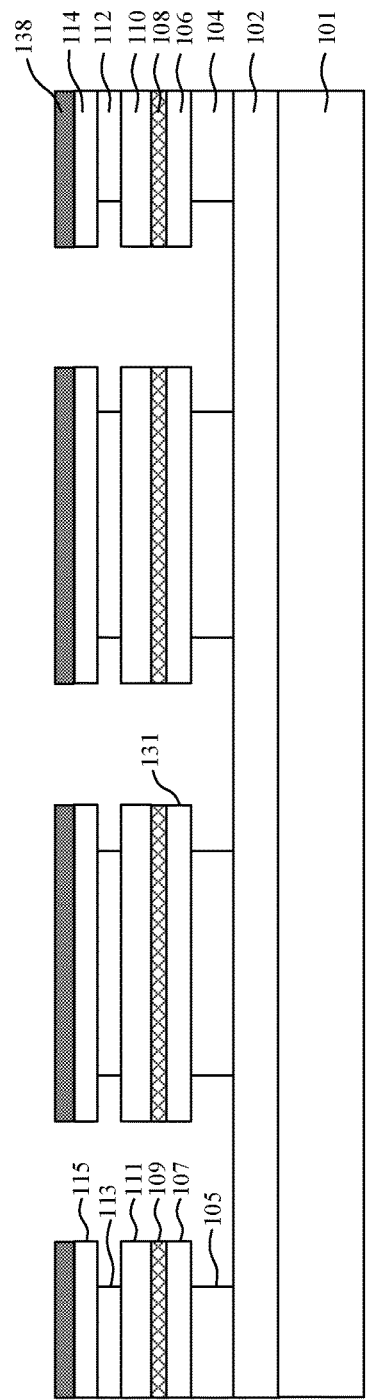
FIG. 25 is a schematic cross-sectional side view illustration of selectively etched cladding layers in accordance with an embodiment.

Referring now to FIG. 25, the mask layers 138 (e.g. $SiN_x$) ised for forming mesa trenches 120 may be retained on the mesa structures 130 and the cladding layers 104, 112 are selectively etched to reduce the respective widths of the cladding layers 104, 112 within the mesa structures 130. As shown the lateral edges 105 (sidewalls) of the top cladding layer 104, and the lateral edges 113 (sidewalls) of the bottom cladding layer 112 are closer to the center vertical axis of the mesa structures than the lateral edges 107, 109, 111 of the top barrier layer 106, the active layer 108, and the bottom barrier layer 110, respectively.

In an embodiment, the width of the cladding layers 104, 112 is reduced with a wet etch operation. For example, wet HCl wet etch is inversely selective with gallium composition, with higher gallium in the composition corresponding to a slower etch rate. In an embodiment, cladding layers 104, 112 have no gallium, or a lower gallium concentration than the surrounding layers. For example, cladding layer 104, 112 may be doped AlInP.

A confinement region 150 with a shallow doping profile may then be diffused into the exposed sidewalls 131 of the mesa structure 130, and optionally any underlying layers (e.g. 102) as illustrated in FIG. 26. Where mesa structures 130 are formed on top of a contact layer 102, the confinement region 150 shallow doping profile may extend partially through or completely through a thickness of the contact layer 102. As shown, the confinement region 150 doping profile is able to penetrate a portion of the active layer 108 by diffusing through the barrier layers 110, 106 directly above and below the active layer 108. Accordingly, the shallow doping profile is capable of covering a larger volume than would be possible from sidewall diffusion only, and with a lower thermal or time budget.

Following the formation of confinement regions 150, the patterned bulk LED substrates of FIG. 26 may be processed similarly as illustrated and described above with regard to FIGS. 6-11 to form an array of LEDs 195 that are poised for pick up and transfer to a receiving substrate. FIGS. 27A-27D are schematic cross-sectional side view illustrations of LEDs 195 including selectively etched cladding layers 104, 112 and confinement regions 150 with shallow doping in accordance with embodiments. In the embodiment illustrated in FIG. 27A, the confinement region 150 dopant concentration may optionally extend to the top surface 137 of the LED body 132 (e.g. top surface of cladding layer 104). In such an embodiment, the top conductive contact 182 may not extend directly over the confinement region 150 dopant profile in order to avoid a shunt path along the LED sidewalls. In the embodiment illustrated in FIG. 27B, a second selective etch process may be performed after forming the confinement region 150 in order to remove the dopant profile from the lateral edges (sidewalls) 113, 105 of the cladding layers 112, 104. In this manner, the shunt path is removed. FIGS. 27C-27D are substantially similar to FIGS. 27A-27B with the addition of the top contact layer 102. As shown, inclusion of the top contact layer may additionally relax the alignment tolerance for the top conductive contact 182.

In an embodiment, an LED 195 includes an LED body 132 including a top cladding layer 104 doped with a first dopant type (e.g. n-type), a top barrier layer 106 below the top cladding layer, an active layer 108 below the top barrier layer 106, a bottom barrier layer 110 below the active layer 108, and a bottom cladding layer 112 below the bottom barrier layer 110. The bottom cladding layer 112 may be doped with a second dopant type (e.g. p-type) opposite the first dopant type. A bottom contact layer 114 may optionally be below the bottom cladding layer 112, with the bottom contact layer 114 also doped with the second dopant type (e.g. p-type). In an embodiment, the lateral edges (sidewalls) 113, 105 of the top cladding layer 104 and the bottom cladding layer 112 are closer to a center vertical axis 199 of the LED body 132 than lateral edges (sidewalls) 111, 109, 107 of the top barrier layer 106, the active layer 108, and the bottom barrier layer 110.

In an embodiment, a confinement region 150 including a p-dopant (e.g. Mg, Zn) concentration spans the lateral edges (sidewalls) 105, 107, 109, 111, 113, 115 of the top n-doped cladding layer 104, the top barrier layer 106, the active layer 108, the bottom barrier layer 110, the bottom p-doped cladding 112 layer, and the bottom p-doped contact 114. In an embodiment, the p-dopant concentration occupies a larger volume of the active layer 108 than the top barrier layer 106, and the p-dopant concentration occupies a larger volume of the active layer 108 than the bottom barrier layer 110.

Figure 28:
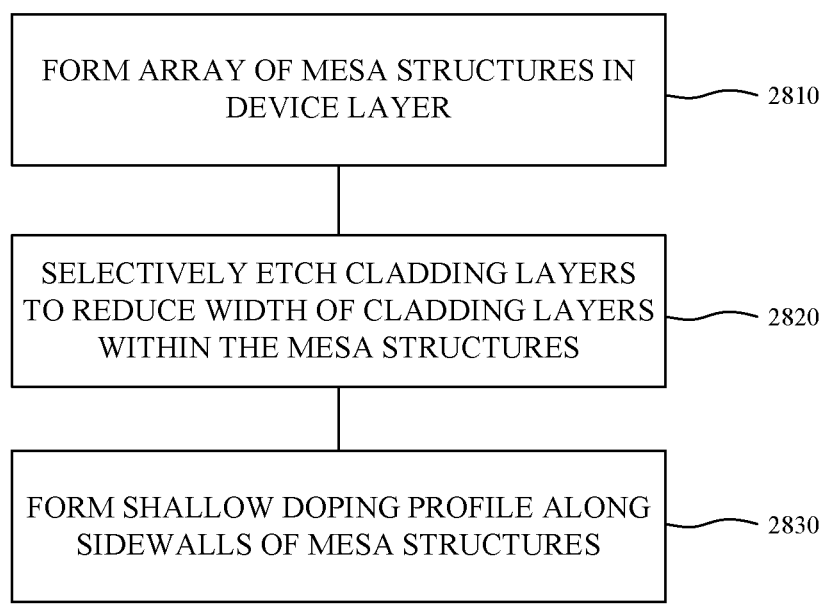
FIG. 28 is a flow chart illustrating a method of forming an LED including selective etching of the cladding layers and regrowth in accordance with an embodiment.

Referring now to FIG. 28 a flow chart is provided illustrating a method of forming an LED including selective etching of the cladding layers and regrowth in accordance with an embodiment. In interest of clarity, the following description of FIG. 28 is made with regard to reference features found in other figures described herein. At operation 2810 an array of mesa structures 130 is formed in the device layer 117 of a bulk LED substrate 100. At operation 2820 the cladding layers 104, 112 are then selectively etched to reduce the respective widths of the cladding layers 104, 112 within the mesa structures 130. At operation 2830 a regrowth layer 175 is formed along sidewalls 131 of the mesa structures 130.

Figure 29:
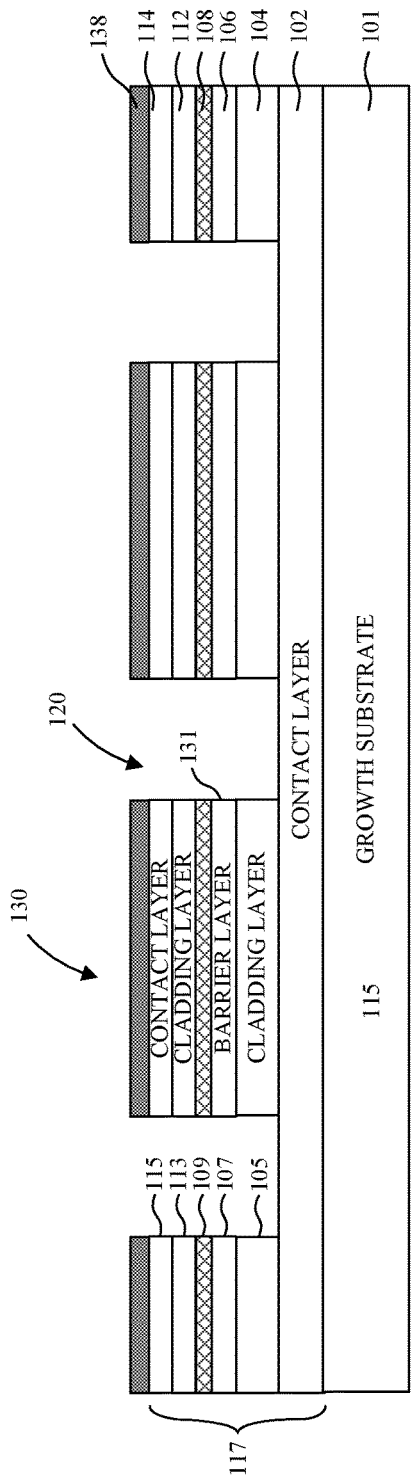
FIG. 29 is a schematic cross-sectional side view illustration of an array of mesa trenches and mesa structures formed in a device layer in accordance with an embodiment.
Figure 30:
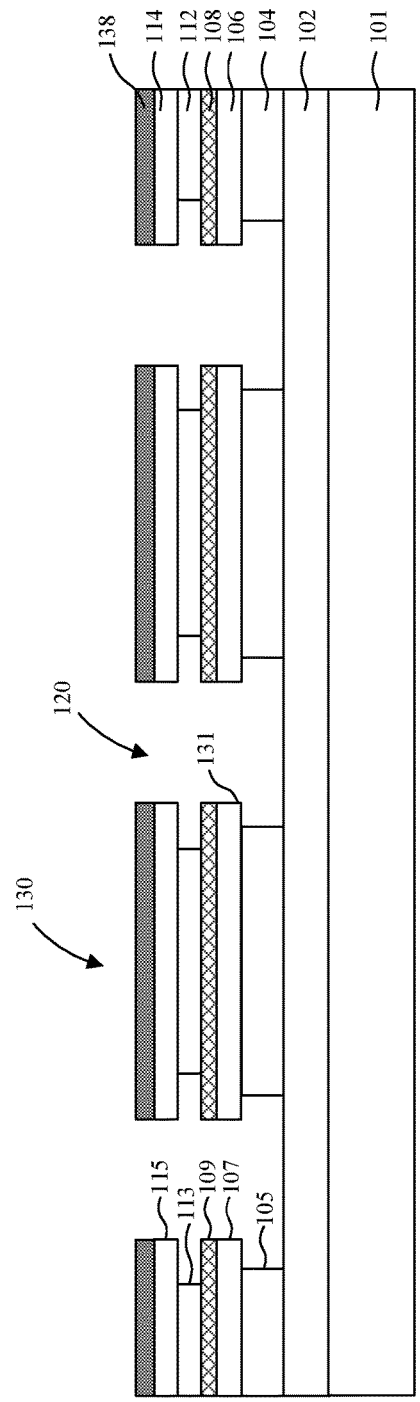
FIG. 30 is a schematic cross-sectional side view illustration of selectively etched cladding layers in accordance with an embodiment.

Referring now to FIG. 29 a schematic cross-sectional side view illustration is provided of an array of mesa trenches 120 and an array of mesa structures 130 formed in a device layer 117 in accordance with an embodiment. The bulk LED substrate 100 illustrated in FIG. 29 may be substantially similar to the bulk LED substrate illustrated and described with regard to FIG. 1A. In the particular embodiment illustrated a (bottom) barrier layer 110 is not illustrated. In other embodiments, a (bottom) barrier layer 110 is included in the bulk LED substrate. In the particular embodiment illustrated, mesa trenches 120 stop on or within the contact layer 102. In another embodiment, mesa trenches 120 may be formed through the contact layer 102.

Referring now to FIG. 25, the mask layers 138 (e.g. $SiN_x$) used for forming mesa trenches 120 may be retained on the mesa structures 130 and the cladding layers 104, 112 are selectively etched to reduce the respective widths of the cladding layers 104, 112 within the mesa structures 130. As shown the lateral edges 105 (sidewalls) of the top cladding layer 104, and the lateral edges 113 (sidewalls) of the bottom cladding layer 112 are closer to the center vertical axis of the mesa structures than the lateral edges 107, 109, 111 of the top barrier layer 106, the active layer 108, and the bottom barrier layer 110, respectively.

In an embodiment, the width of the cladding layers 104, 112 is reduced with a wet etch operation. For example, wet HCl wet etch is inversely selective with gallium composition, with higher gallium in the composition corresponding to a slower etch rate. In an embodiment, cladding layers 104, 112 have no gallium, or a lower gallium concentration than the surrounding layers. For example, cladding layer 104, 112 may be doped AlInP.

A regrowth layer 175 is then formed on the exposed sidewalls 131 of the mesa structures 130 and the underlying layers (e.g. 102) as illustrated in FIG. 31. As shown, the regrowth layer 175 at least partially fills, and may completely fill, the voids directly between the contact layer 114 and active layer 108 that were created as a result of the selective etching operation. In an embodiment, the regrowth layer 175 is a semi-insulating layer, n-type layer, or unintentionally doped. For example, regrowth layer 175 may be AlIP, with Te or Fe dopants.

Following the formation of regrowth layer 175, the patterned bulk LED substrates of FIG. 31 may be processed similarly as illustrated and described above with regard to FIGS. 6-11 to form an array of LEDs 195 that are poised for pick up and transfer to a receiving substrate. FIGS. 32A-32B are schematic cross-sectional side view illustrations of LEDs 195 including selectively etched cladding layers 104, 112 and a regrowth layer 175 in accordance with embodiments. In the embodiment illustrated in FIG. 32A, the regrowth layer 175 may be exposed at the top surface 137 of the LED body 132 (e.g. top surface of cladding layer 104). In such an embodiment, the top conductive contact 182 may not be in direct contact with the regrowth layer 175 in order to avoid a shunt path along the LED sidewalls. In the embodiment illustrated in FIG. 32B, a top contact layer 102 is included. For example, the top contact layer 102 may be patterned similarly as described with regard to FIG. 10. In this manner, the shunt path is removed from the top surface 137 of the LED body 132. As shown, inclusion of the top contact layer 102 may additionally relax the alignment tolerance for the top conductive contact 182.

In an embodiment, an LED 195 includes an LED body 132 including a top cladding layer 104 doped with a first dopant type (e.g. n-type), a top barrier layer 106 below the top cladding layer 104, an active layer 108 below the top barrier layer 106, and a bottom cladding layer 112 below the active layer 108. The bottom cladding layer 112 may be doped with a second dopant type (e.g. p-type) opposite the first dopant type. A bottom contact layer 114 may be below the bottom cladding layer 112. The bottom contact layer 114 may also be doped with the second dopant type (e.g. p-type). In an embodiment, lateral edges (sidewalls) 105, 113 of the top cladding layer 104 and the bottom cladding layer 112 are closer to a center vertical axis 199 of the LED body 132 than lateral edges 107, 109 of the top barrier layer 106 and the active layer 108.

In an embodiment, a regrown layer 175 is formed directly on the lateral edges (sidewalls) 105, 107, 109, 113, 115 of the top cladding layer 104, the top barrier layer 106, the active layer 108, the bottom cladding layer 112, and the bottom contact layer 114. In an embodiment, the regrown layer 175 is doped with a dopant selected from the group consisting of Te and Fe. In an embodiment, the regrown layer 175 fills a volume directly between the bottom contact layer 114 and the active layer 108, and is laterally adjacent to the bottom cladding layer 112.

Referring now to FIGS. 34A-36C various process flows are illustrated for methods of forming LEDs with selectively etched layers. The particular embodiments illustrated in FIGS. 34A-36C may be utilized with bulk LED substrates 400 similar to that described with regard to FIG. 37A. Additionally, the embodiments illustrated in FIGS. 34A-36C may be performed utilizing photo electro chemical (PEC) etching techniques in which the bulk LED substrates 400 are submerged in an etching solution (such as KOH, HCL) and either a light is shone or a bias is applied to initiate etching, which can be bandgap, dopant, orientation, and material selective (among other possibilities). In an embodiment, shining light on the bulk LED substrate 400 targets the bandgap of a specific layer for selective etching relative to other layers in the structure. In an embodiment, the smallest bandgap material is selected for etching. In an embodiment, the smallest bandgap material (other than in the active region, e.g. quantum well) is selected for etching.

FIGS. 33A-33D are schematic cross-sectional side view illustrations of a method of forming LEDs with a selectively etched active region in accordance with an embodiment. The bulk LED substrate 400 illustrated in FIG. 33A may be substantially similar to that illustrated in FIG. 37A. Mesa trenches 420 may then be formed as illustrated in FIG. 33B, followed by selective etching of the active region 408 as illustrated in FIG. 33B resulting in a reduced width of the lateral edges (sidewalls) 409 of the active region 408. In an embodiment, selective etching of the active region 408 is performed with a PEC etch. In an embodiment, the active region 408 includes the smallest bandgap in the structure, and a laser with wavelength above the active region, and below the other layers in the structure causes the active region 408 to etch selectively in the etching solution. In accordance with an embodiment, PEC etching additionally removes material of the active region 408 which has been damaged during etching of the mesa trenches 420 (e.g. during plasma etching), which may improve device performance In an embodiment, a bottom contact layer 480 (which may be similar to bottom contact layer 180) is then formed over the doped semiconductor layer 412, as illustrated in FIG. 33D. Additional processing may then be performed to complete fabrication of the LED devices as previously described.

In an embodiment an LED structure includes an LED body with a top doped semiconductor layer 404 doped with a first dopant type (e.g. n-type), an active region 408 below the top doped semiconductor layer 404, and a bottom doped semiconductor layer 412 doped with a second dopant type (e.g. p-type) opposite the first dopant type, where lateral edges 409 of the active region 408 are closer to a center vertical axis of the LED body than lateral edges 405, 413 of the top doped semiconductor layer 404 and the bottom doped semiconductor layer 412, respectively. In an embodiment, the top and bottom doped semiconductor layers include one or more layers, such as a cladding layer and barrier layer.

FIGS. 34A-34C are schematic cross-sectional side view illustrations of a method of forming LEDs with a selectively etched sacrificial region in accordance with an embodiment. The bulk LED substrate 400 illustrated in FIG. 34A is similar to that illustrated in FIG. 33A with the addition of sacrificial layer 486 within the doped semiconductor layer 412. In accordance with embodiments, sacrificial layer 486 may be a thin bulk layer (e.g. 5-50 nm thick) or a super lattice type structure. In an embodiment, sacrificial layer 486 includes InGaN. In an embodiment in which doped semiconductor layer 412 is p-doped, the sacrificial layer 486 may likewise be p-doped.

Referring now to FIG. 34B, a bottom contact layer 480 is formed over the doped semiconductor layer 412, and mesa trenches 420 are formed. Bottom contact layer 480 may be formed before or after the mesa trenches 420. Referring to FIG. 34C, the sacrificial layer 486 is selectively etched, for example with PEC etching, resulting in a reduced width of the lateral edges (sidewalls) 487 of the sacrificial layer 486. Additional processing may then be performed to complete fabrication of the LED devices as previously described. In the resultant LED device structure, the sacrificial layer 486 may function to confine current internally within the LED device, and prevent carriers from leaking to the sidewalls and following a shunt path along the damaged sidewall materials. In accordance with embodiments, the sacrificial layer may in principal be placed above or below the active region 408, or both. In an embodiment, p-GaN may have a higher resistivity than n-GaN, and location of the sacrificial layer 486 within the p-doped semiconductor layer 412 may potentially result in better current confinement. However, embodiments are not so limited.

In an embodiment an LED structure includes an LED body with a top doped semiconductor layer 404 doped with a first dopant type (e.g. n-type), an active region 408 below the top doped semiconductor layer 404, a bottom doped semiconductor layer 412 doped with a second dopant type (e.g. p-type) opposite the first dopant type, and a sacrificial layer 486 within the bottom doped semiconductor layer 412. Lateral edges 487 of the sacrificial layer 486 may be closer to a center vertical axis than lateral edges one or more of the layers in the LED body, such as lateral edges 413 of the bottom doped semiconductor layer 412, lateral edges 409 the active region 408, and lateral edges 413 of the top doped semiconductor layer 404. In an embodiment, the sacrificial layer 486 has a lower bandgap than materials forming the bottom doped semiconductor layer 412 and the top doped semiconductor layer 404.

FIGS. 35A-35C are schematic cross-sectional side view illustrations of a method of forming LEDs with a selectively etched sacrificial region in accordance with an embodiment. FIGS. 35A-35C are substantially similar to FIGS. 34A-34C with the exception that a sacrificial layer 488 is formed within the doped semiconductor layer 404. In accordance with embodiments, sacrificial layer 488 may be a thin bulk layer (e.g. 5-50 nm thick) or a super lattice type structure. In an embodiment, sacrificial layer 488 includes InGaN. In an embodiment in which doped semiconductor layer 404 is n-doped, the sacrificial layer 488 may likewise be n-doped. As illustrated in FIG. 35C, selective etching of the sacrificial layer 488, for example, with PEC etching, may result in a reduced width of the lateral edges (sidewalls) 489 of the sacrificial layer 488. Additional processing may then be performed to complete fabrication of the LED devices as previously described.

In an embodiment an LED structure includes an LED body with a top doped semiconductor layer 404 doped with a first dopant type (e.g. n-type), an active region 408 below the top doped semiconductor layer 404, a bottom doped semiconductor layer 412 doped with a second dopant type (e.g. p-type) opposite the first dopant type, and a sacrificial layer 488 within the top doped semiconductor layer 404. Lateral edges 489 of the sacrificial layer 488 may be closer to a center vertical axis than one or more of the layers in the LED body, such as the lateral edges 413 of the bottom doped semiconductor layer 412, lateral edges 409 of the active region 408, and lateral edges 405 of the top doped semiconductor layer 404. In an embodiment, the sacrificial layer 488 has a lower bandgap than materials forming the bottom doped semiconductor layer 412 and the top doped semiconductor layer 404.

Referring now to FIGS. 36A-36C schematic cross-sectional side view illustrations are provided of a method of forming LEDs with selectively etched sacrificial layers 486, 488 in accordance with embodiments. Thus, the sacrificial layers 486, 488 may be located on both sides of the active region 408. Additional processing may then be performed to complete fabrication of the LED devices as previously described.

In an embodiment, an LED structure includes a sacrificial layer 486 within the bottom doped semiconductor layer 412 and a sacrificial layer 488 within the top doped semiconductor layer 404. Lateral edges 487 of the sacrificial layer 486, and lateral edges 489 of the sacrificial layer 488 may be closer to a center vertical axis than one or more of the layers in the LED body, such as the bottom doped semiconductor layer 412, the active region 408, and the top doped semiconductor layer 404.

Figure 38:
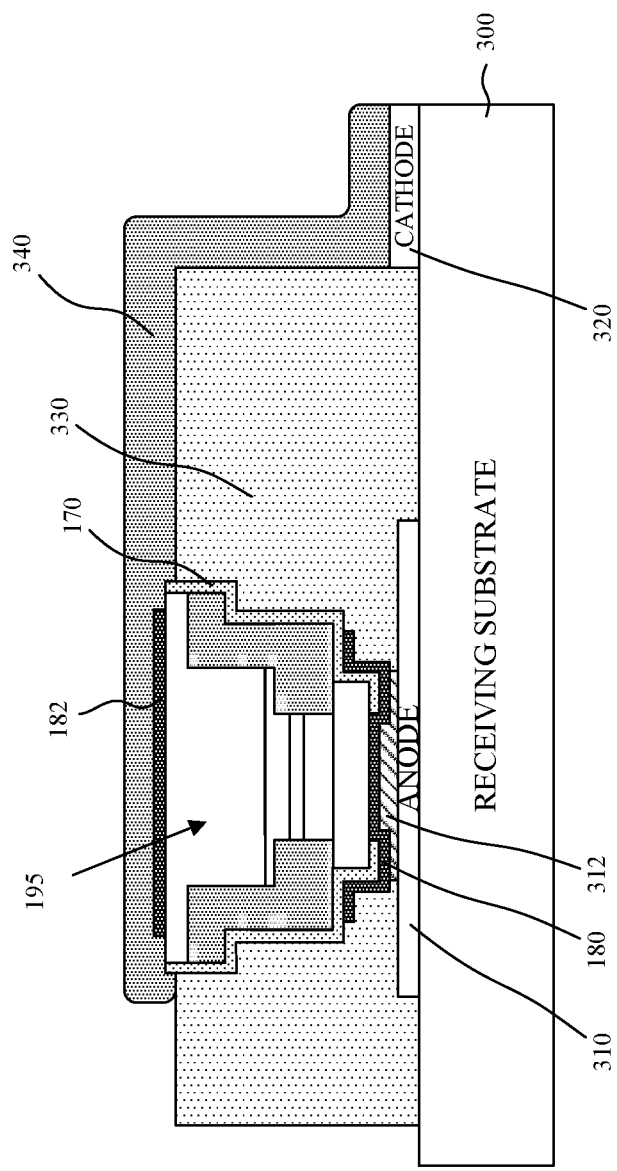
FIG. 38 is a schematic cross-sectional side view illustration of an LED integrated on a backplane in accordance with an embodiment.

FIG. 38 is a schematic cross-sectional side view illustration of an LED 195 bonded to a receiving substrate 300 in accordance with an embodiment. LED 195 may be any of the LEDs described herein. The receiving substrate 300 may be a display backplane. As shown, the LED 195 is a vertical LED, with the bottom conductive contact 180 bonded to an electrode (e.g. anode) 310 with a bonding material 312, such as a solder material. Sidewalls of the LED 195 may be surrounded by a dielectric material 330. The dielectric material may serve several functions such as securing the LED 195 to the receiving substrate 300, as well as providing step coverage for a top conductive layer 340, such as a conductive oxide or conductive polymer, used to electrically connect the top conductive contact 182 to an electrode (e.g. cathode) 320. For example, the dielectric material 330 may be an oxide, or polymer material. The dielectric material 330, and optionally the sidewall passivation layer 170, alone or in combination, may additionally protect against electrical shorting between the top conductive layer 340 and sidewalls of the LED.

Figure 39:
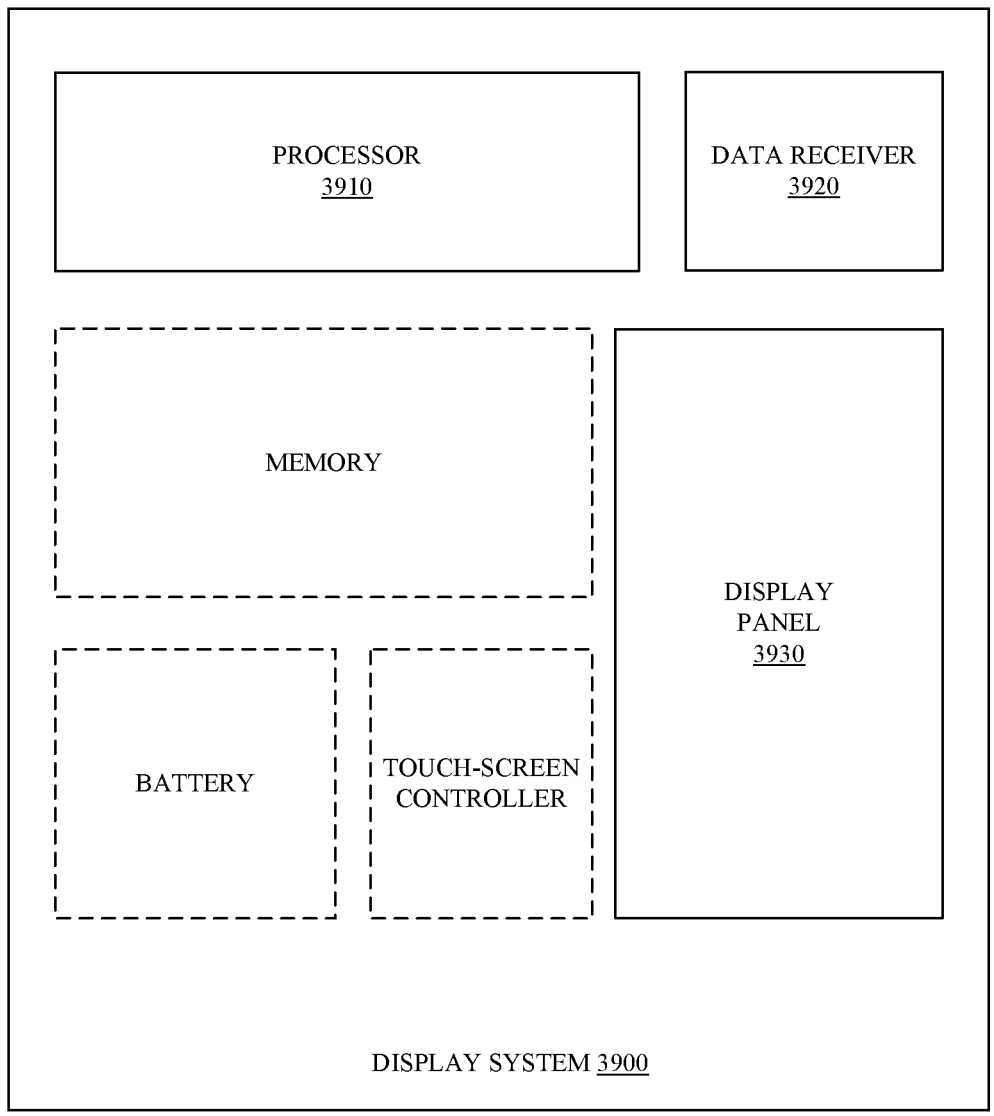
FIG. 39 is a schematic illustration of a display system in accordance with an embodiment.

FIG. 39 illustrates a display system 3900 in accordance with an embodiment. The display system houses a processor 3910, data receiver 3920, and one or more display panels 3930 which may include an array of LEDs 195 bonded to a backplane (e.g. 300). The display panels 3930 may additionally include one or more display driver ICs such as scan driver ICs and data driver ICs. The data receiver 3920 may be configured to receive data wirelessly or wired. Wireless may be implemented in any of a number of wireless standards or protocols.

Depending on its applications, the display system 3900 may include other components. These other components include, but are not limited to, memory, a touch-screen controller, and a battery. In various implementations, the display system 3900 may be a wearable device (e.g. watch), television, tablet, phone, laptop, computer monitor, kiosk, digital camera, handheld game console, media display, ebook display, or large area signage display.

In utilizing the various aspects of the embodiments, it would become apparent to one skilled in the art that combinations or variations of the above embodiments are possible for fabricating LEDs including one or more current confinement structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A light emitting structure comprising:
    a body including:
        a first cladding layer doped with a first dopant type;
        a barrier layer; and
        an active layer between the first cladding layer and the barrier layer;
    a pillar structure that protrudes from a first surface of the body, wherein the pillar structure includes a second cladding layer doped with a second dopant type opposite the first dopant type; and
    a confinement region including a dopant concentration spanning sidewalls of the body and the first surface of the body, wherein the dopant concentration is formed of the second dopant type and encroaches from the sidewalls of the body toward a center vertical axis of the light emitting structure and from the first surface of the body toward the active layer, and the dopant concentration laterally encroaches toward a center vertical axis of the light emitting structure within the body past sidewalls of the pillar structure.

2. The light emitting structure of claim 1, wherein the pillar structure protrudes from a surface of the barrier layer, the confinement region dopant concentration spans the surface of the barrier layer, and the dopant concentration encroaches laterally toward the center vertical axis within the barrier layer past the sidewalls of the pillar structure.

3. The light emitting structure of claim 1, wherein the first dopant type is n-type, the second dopant type is p-type, and the dopant concentration is formed of a dopant selected from the group consisting of Mg and Zn.

4. The light emitting structure of claim 1, further comprising:
    a conformal passivation layer formed on and spanning the sidewalls of the body, the sidewalls of the pillar structure, and a surface of the pillar structure opposite the body;
    an opening in the conformal passivation layer on the surface of the pillar structure; and
    a conductive contact formed on the surface of the pillar structure and within the opening of the conformal passivation layer.

5. The light emitting structure of claim 1, wherein the dopant concentration encroaches further toward the center vertical axis within the barrier layer than within the active layer and the first cladding layer.

6. The light emitting structure of claim 5, further comprising a base including a first surface, wherein the body protrudes from the first surface of the base, and the first surface of the base is wider than the body.

7. The light emitting structure of claim 6, wherein the dopant concentration spans the first surface of the base, and encroaches toward a second surface of the base opposite the first surface of the base.

8. The light emitting structure of claim 7, further comprising a second conductive contact on the second surface of the base.

9. The light emitting structure of claim 8, wherein the conductive contact is bonded to a contact pad on a display substrate with a solder material.

10. The light emitting structure of claim 1, wherein the dopant concentration encroaches further toward the center vertical axis within the barrier layer and the active layer than within the first cladding layer.

11. The light emitting structure of claim 10, further comprising a base including a first surface, wherein the body protrudes from the first surface of the base, and the first surface of the base is wider than the body.

12. The light emitting structure of claim 11, wherein the dopant concentration spans the first surface of the base, and encroaches toward a second surface of the base opposite the first surface of the base.

13. The light emitting structure of claim 12, further comprising a second conductive contact on the second surface of the base.

14. The light emitting structure of claim 13, wherein the conductive contact is bonded to a contact pad on a display substrate with a solder material.

* * * * *